United States Patent
Lai et al.

(10) Patent No.: US 12,412,817 B2
(45) Date of Patent: Sep. 9, 2025

(54) INTEGRATED CIRCUIT PACKAGE AND METHOD

(71) Applicant: Taiwan Semiconductor Manufacturing Co., Ltd., Hsinchu (TW)

(72) Inventors: Chi-Hui Lai, Taichung (TW); Shu-Rong Chun, Zhubei (TW); Kuo Lung Pan, Hsinchu (TW); Tin-Hao Kuo, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 20 days.

(21) Appl. No.: 17/977,301

(22) Filed: Oct. 31, 2022

(65) Prior Publication Data
US 2023/0053190 A1  Feb. 16, 2023

Related U.S. Application Data

(60) Continuation of application No. 17/227,608, filed on Apr. 12, 2021, now Pat. No. 11,488,897, which is a
(Continued)

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/565* (2013.01); *H01L 23/3107* (2013.01); *H01L 23/49838* (2013.01); *H01L 23/5386* (2013.01); *H01L 24/09* (2013.01); *H01L 2224/02371* (2013.01); *H01L 2224/02379* (2013.01)

(58) Field of Classification Search
CPC ................. H01L 23/49811; H01L 24/19–20
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |

(Continued)

FOREIGN PATENT DOCUMENTS

CN   117594579 A  *  2/2024  ....... H01L 23/49816

*Primary Examiner* — Peter Bradford
(74) *Attorney, Agent, or Firm* — Slater Matsil, LLP

(57) ABSTRACT

In an embodiment, a device includes: a package component including: a first integrated circuit die; an encapsulant at least partially surrounding the first integrated circuit die; a redistribution structure on the encapsulant, the redistribution structure physically and electrically coupling the first integrated circuit die; a first module socket attached to the redistribution structure; an interposer attached to the redistribution structure adjacent the first module socket, the outermost extent of the interposer extending beyond the outermost extent of the redistribution structure; and an external connector attached to the interposer.

20 Claims, 26 Drawing Sheets

Related U.S. Application Data division of application No. 16/529,119, filed on Aug. 1, 2019, now Pat. No. 10,978,382.

(60) Provisional application No. 62/798,600, filed on Jan. 30, 2019.

(51) Int. Cl.
*H01L 21/56* (2006.01)
*H01L 23/00* (2006.01)
*H01L 23/31* (2006.01)
*H01L 23/538* (2006.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0029639 A1* | 1/2014 | Zarbock | G02B 6/4269 372/50.1 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2017/0062383 A1 | 3/2017 | Yee et al. | |
| 2017/0199328 A1* | 7/2017 | Shubin | G02B 6/1228 |
| 2019/0317287 A1* | 10/2019 | Raghunathan | G02B 6/426 |
| 2019/0326273 A1 | 10/2019 | Bhagavat et al. | |
| 2023/0260983 A1* | 8/2023 | Lee | H01L 23/34 257/668 |

* cited by examiner

US 12,412,817 B2

INTEGRATED CIRCUIT PACKAGE AND METHOD

PRIORITY CLAIM AND CROSS-REFERENCE

This application is a continuation of U.S. patent application Ser. No. 17/227,608, filed on Apr. 12, 2021, entitled "Integrated Circuit Package and Method," which is a divisional of U.S. patent application Ser. No. 16/529,119, filed on Aug. 1, 2019, entitled "Integrated Circuit Package and Method," now U.S. Pat. No. 10,978,382, issued on Apr. 13, 2021, which claims the benefit of U.S. Provisional Application No. 62/798,600, filed on Jan. 30, 2019, which applications are hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
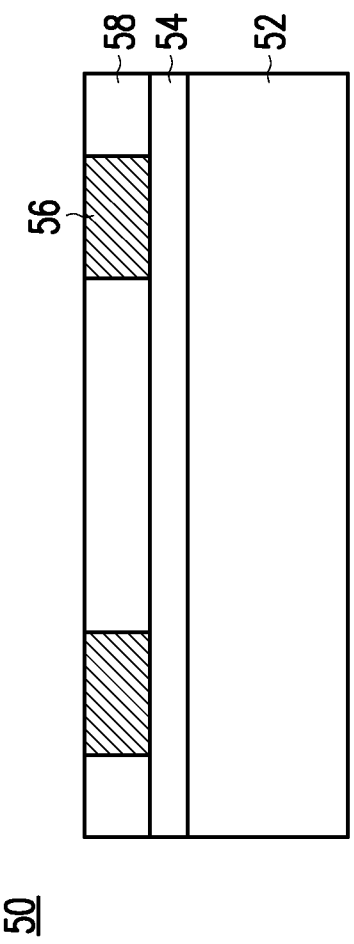
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, fan-out interposer(s) are integrated on a system-on-wafer, such as a super-large fan-out wafer-level package (FOWLP), allowing the available I/O pin count for the system-on-wafer to be expanded. The fan-out interposer(s) are attached at the edges of the wafer, and extend beyond the edges of the wafer. External connectors are then attached to the interposer(s). The external connectors may thus extend beyond the outermost extent of the wafer, thereby increasing the surface area available for the external connectors. More external connectors may thus be included with the system-on-wafer.

FIG. 1 illustrates a cross-sectional view of an integrated circuit die 50, in accordance with some embodiments. The integrated circuit die 50 will be packaged in subsequent processing to form an integrated circuit package component. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.) or passive devices (e.g., capacitors, resistors, inductors, etc.).

An interconnect structure 54 is over the semiconductor substrate 52, and interconnects the devices to form an integrated circuit. The interconnect structure 54 may be formed by, for example, metallization patterns in dielectric layers on the semiconductor substrate 52. The metallization patterns include metal lines and vias formed in one or more low-k dielectric layers. The metallization patterns of the interconnect structure 54 are electrically coupled to the devices of the semiconductor substrate 52. The integrated circuit die 50 further includes pads, such as aluminum pads, to which external connections are made. The pads are on the active side of the integrated circuit die 50, such as in and/or on the interconnect structure 54. One or more passivation films may be on the integrated circuit die 50, such as on portions of the interconnect structure 54. Die connectors 56, such as conductive pillars (for example, formed of a metal such as copper), are physically and electrically coupled to the interconnect structure 54. The die connectors 56 may be formed by, for example, plating, or the like. The die connectors 56 electrically couple the respective integrated circuits of the integrated circuit die 50.

Optionally, solder regions (e.g., solder balls or solder bumps) may be disposed on the pads of the interconnect structure 54. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and packaging, and dies, which fail the CP testing, are not packaged. After testing, the solder regions may be removed in subsequent processing steps.

A dielectric layer 58 may (or may not) be on the active side of the integrated circuit die 50, such as on the passivation films and the die connectors 56. The dielectric layer 58 laterally encapsulates the die connectors 56, and the dielectric layer 58 is laterally coterminous with the integrated circuit die 50. Initially, the dielectric layer 58 may bury the die connectors 56, such that the topmost surface of the dielectric layer 58 is above the topmost surfaces of the die connectors 56. In some embodiments where solder regions are disposed on the die connectors 56, the dielectric layer 58 may also bury the solder regions. Alternatively, the solder regions may be removed prior to forming the dielectric layer 58.

The dielectric layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 58 may be formed, for example, by spin coating, lamination, chemical vapor deposition (CVD), or the like. In some embodiments, the die connectors 56 are exposed through the dielectric layer 58 during formation of the integrated circuit die 50. In some embodiments, the die connectors 56 remain buried and are exposed during a subsequent process for packaging the integrated circuit die 50. Exposing the die connectors 56 may remove any solder regions that may be present on the die connectors 56.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 54.

FIGS. 2-11 illustrate cross-sectional views of intermediate steps during a process for forming a package component 100, in accordance with some embodiments. The package component 100 is a reconstructed wafer having multiple package regions, with one or more of the integrated circuit dies 50 being packaged in each of the package regions. The package regions include computing sites 102 and connecting sites 104. Each of the computing sites 102 may have e.g., logic functions, memory functions, or the like, and the package component 100 may be a single computing device comprising the computing sites 102 and connecting sites 104, such as a system-on-wafer assembly. For example, the package component 100 may be an artificial intelligence (AI), machine learning (ML), or deep learning (DL) accelerator, and each computing site 102 may be a neural network node for the accelerator. Each of the connecting sites 104 may have, e.g., external connectors (discussed further below), and the computing sites 102 of the package component 100 may connect to external systems through the connecting sites 104. Example systems for the package component 100 include AI servers, high-performance computing (HPC) systems, high power computing devices, cloud computing systems, edge computing systems, and the like.

As noted above, the package component 100 will be part of a system-on-wafer assembly. As such, the package component 100 is large. For example, the package component 100 can have a surface area in excess of 10,000 mm$^2$. A large surface area allows for a large quantity of computing sites 102 and connecting sites 104. Two computing sites 102, e.g., computing sites 102A and 102B, and two connecting sites 104, e.g., connecting sites 104A and 104B, are illustrated in FIGS. 2-11, but it should be appreciated that the package component 100 may include many computing sites 102 and connecting sites 104, and the sites may be laid out in a variety of manners.

Figure 2:
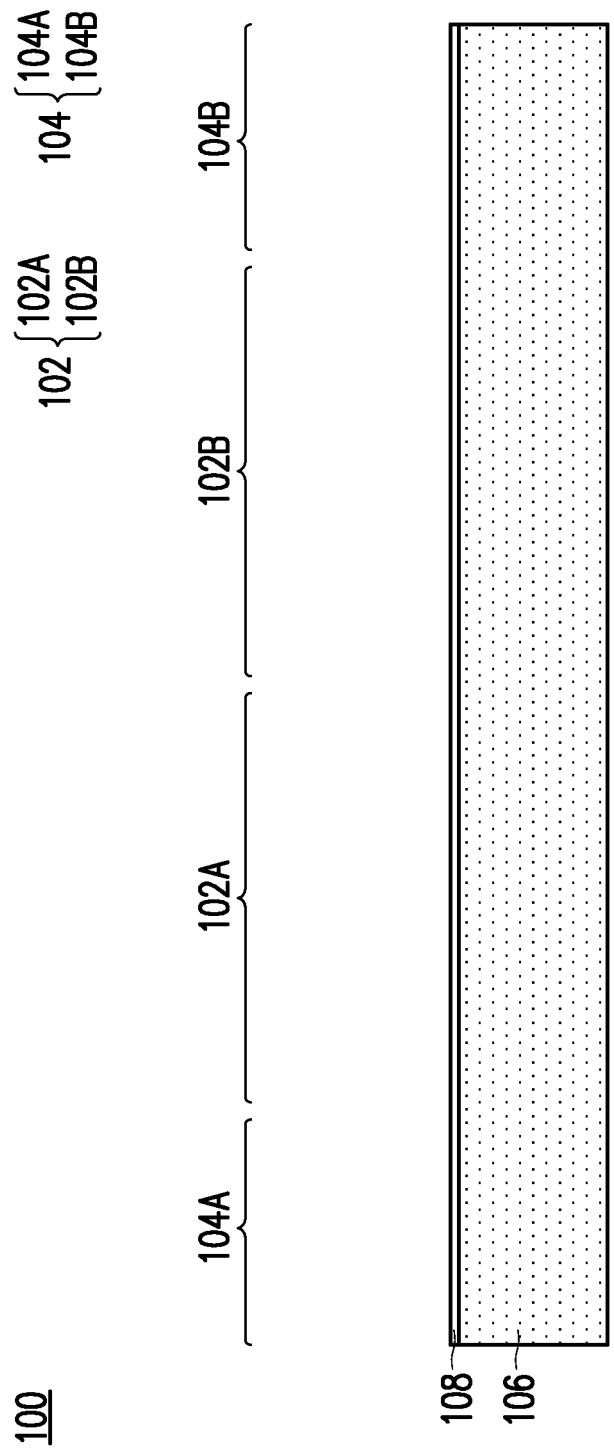
FIGS. 2-11 illustrate cross-sectional views of intermediate steps during a process for forming a package component, in accordance with some embodiments.

In FIG. 2, a carrier substrate 106 is provided, and an adhesive layer 108 is formed on the carrier substrate 106. The carrier substrate 106 may be a glass carrier substrate, a ceramic carrier substrate, or the like. The carrier substrate 106 may be a wafer, such that multiple packages can be formed on the carrier substrate 106 simultaneously. The adhesive layer 108 may be removed along with the carrier substrate 106 from the overlying structures that will be formed in subsequent steps. In some embodiments, the adhesive layer 108 is any suitable adhesive, epoxy, die attach film (DAF), or the like, and is applied over the surface of the carrier substrate 106.

Figure 3:
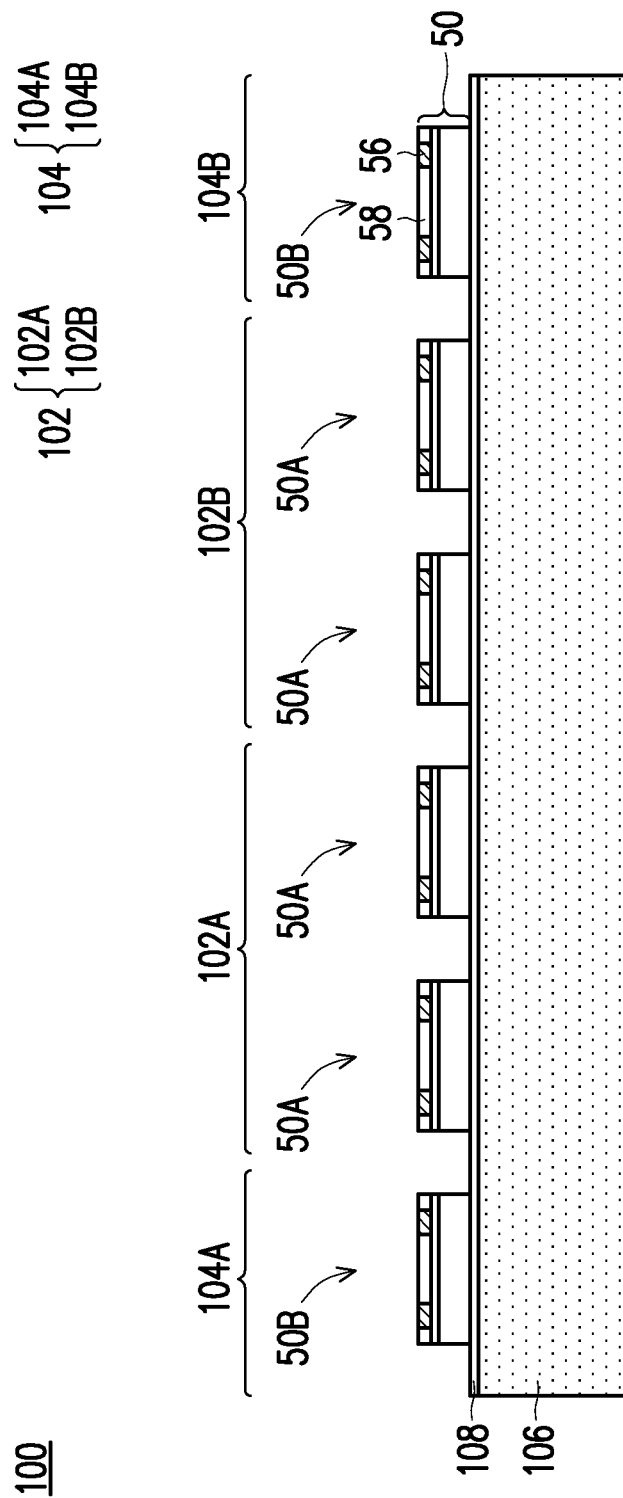

In FIG. 3, integrated circuit dies 50 are attached to the adhesive layer 108. A desired type and quantity of integrated circuit dies 50 are attached in each of the computing sites 102A and 102B and the connecting sites 104A and 104B. In some embodiments, a first type of integrated circuit die, such as a SoC die 50A, is attached in the computing sites 102A and 102B, and a second type of integrated circuit die, such as an I/O interface die 50B, is attached in the connecting sites 104A and 104B. Although a single integrated circuit die 50 is illustrated in some sites, it should be appreciated that multiple integrated circuit dies may be attached adjacent one another in some or all of the sites. When multiple integrated circuit dies are attached in each site, they may be of the same technology node, or of different technology nodes. For example, the integrated circuit dies 50 may include dies formed at a 10 nm technology node, dies formed at a 7 nm technology node, the like, or combinations thereof.

Figure 4:
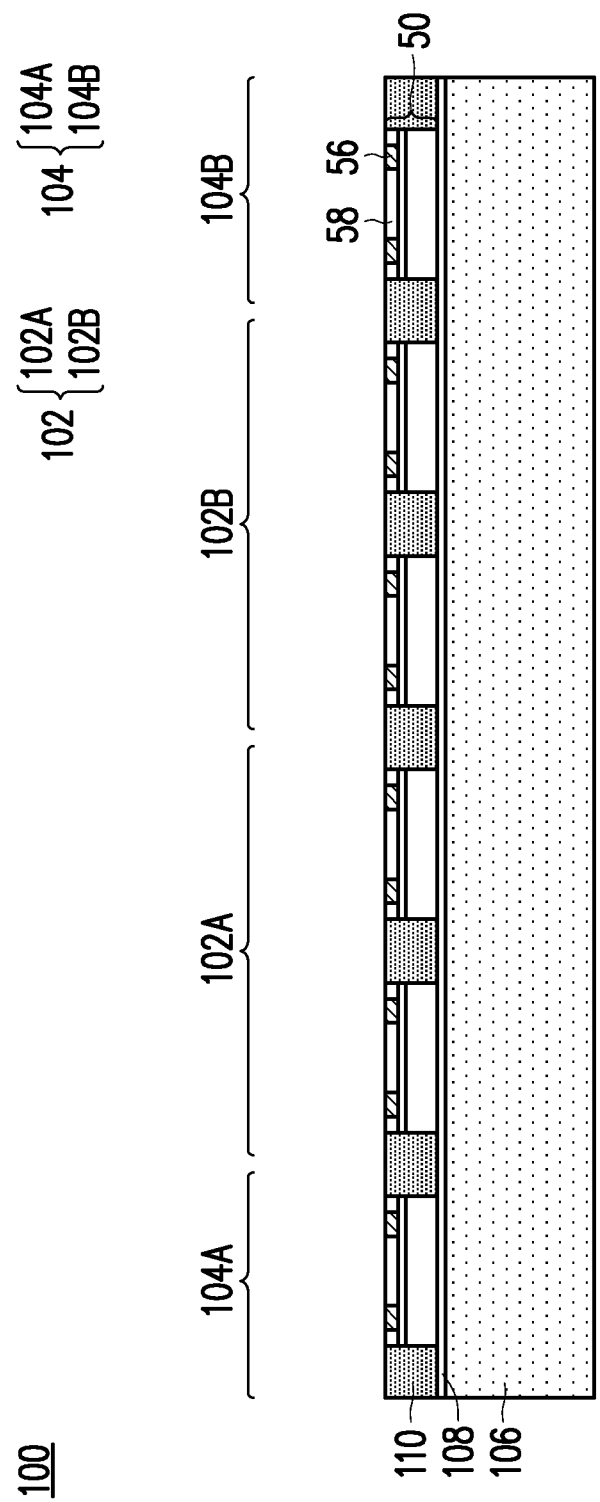

In FIG. 4, an encapsulant 110 is formed on and around the various components. After formation, the encapsulant 110 encapsulates the integrated circuit dies 50. The encapsulant 110 may be a molding compound, epoxy, or the like, and may be applied by compression molding, transfer molding, or the like. The encapsulant 110 may be applied in liquid or semi-liquid form and then subsequently cured. In some embodiments, the encapsulant 110 is formed over the carrier substrate 106 such that the integrated circuit dies 50 are buried or covered, and a planarization process is then performed on the encapsulant 110 to expose the die connectors 56 of the integrated circuit dies 50. Topmost surfaces of the encapsulant 110, die connectors 56, and dielectric layers 58 are coplanar after the planarization process. The planarization process may be, for example, a chemical-mechanical polish (CMP).

Figure 5:
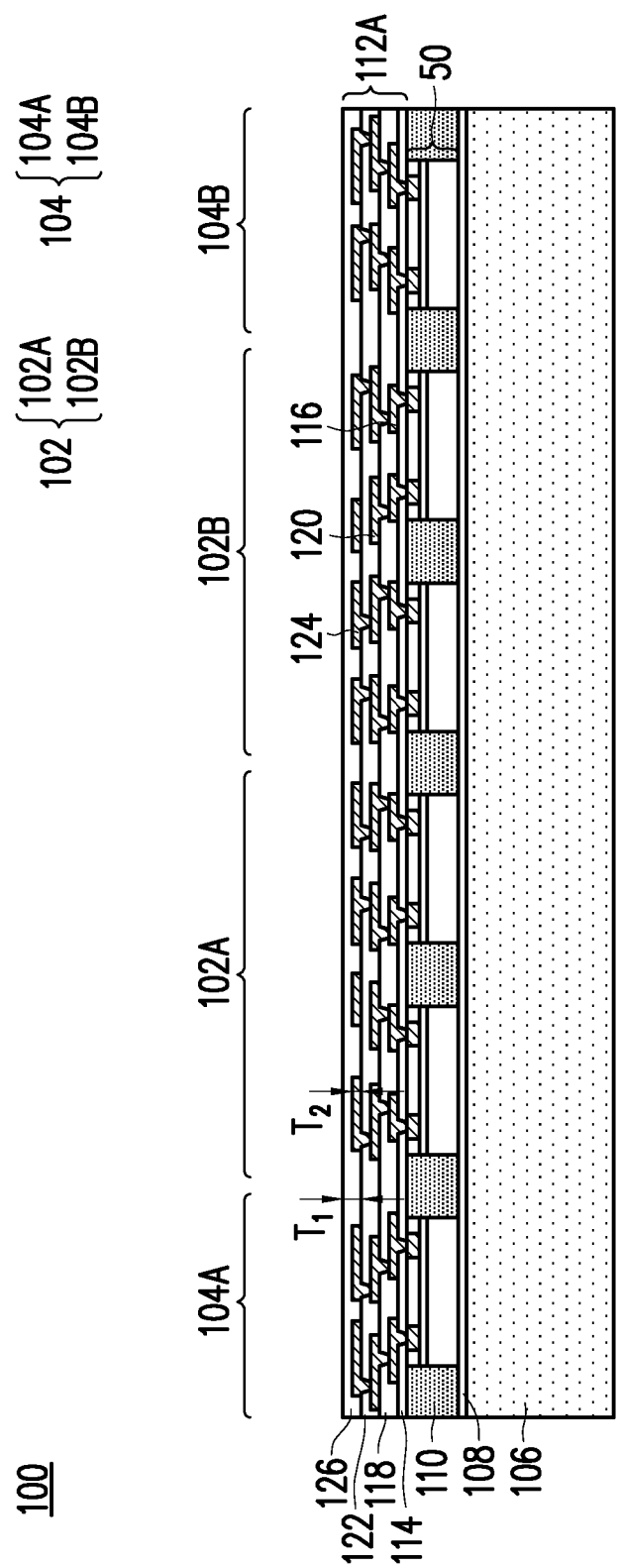
Figure 6:
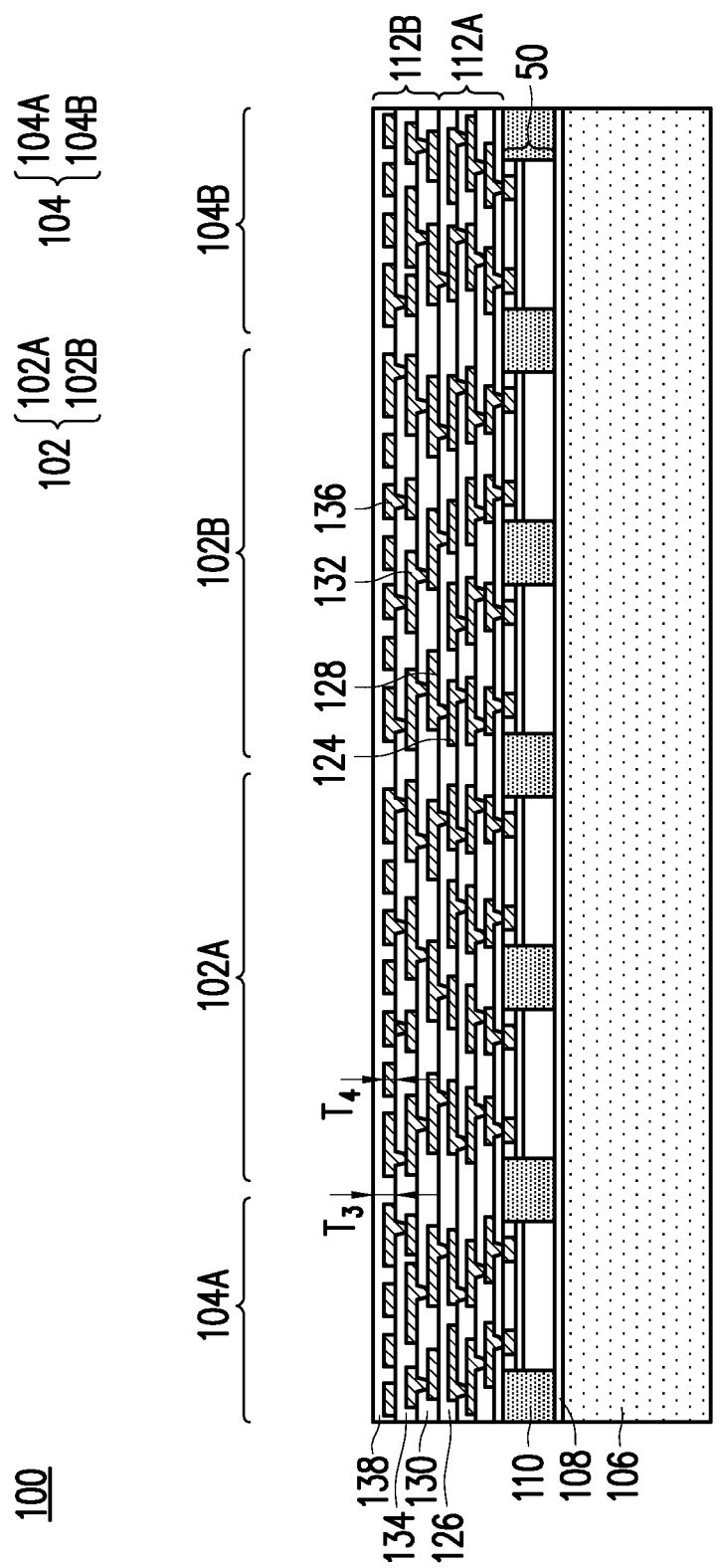
Figure 7:
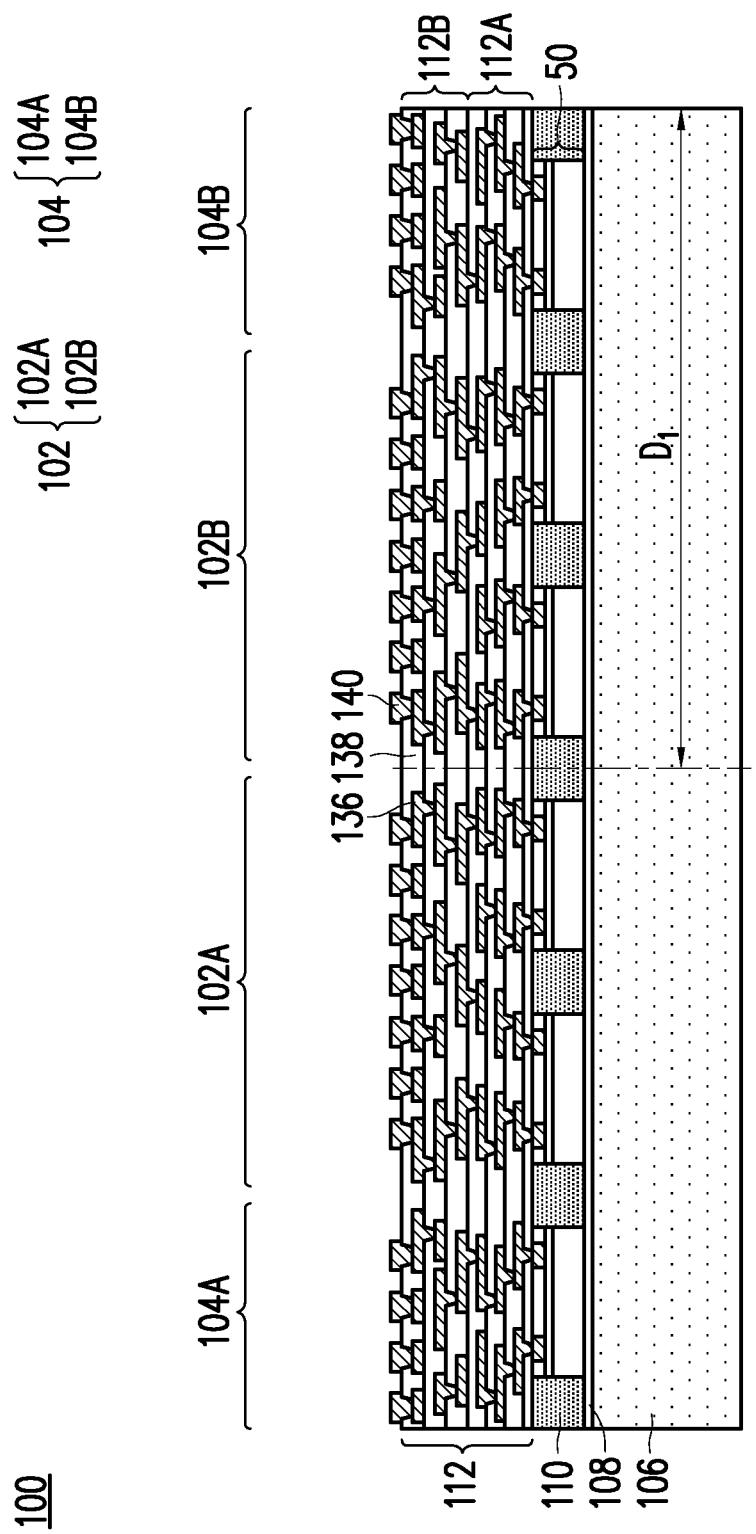

In FIGS. 5 through 7, a redistribution structure 112 (see FIG. 7) having a fine-featured portion 112A and a coarse-featured portion 112B is formed over the encapsulant 110 and integrated circuit dies 50. The redistribution structure 112 includes metallization patterns, dielectric layers, and under-bump metallurgies (UBMs). The metallization patterns may also be referred to as redistribution layers or redistribution lines. The redistribution structure 112 is shown as an example having six layers of metallization patterns. More or fewer dielectric layers and metallization patterns may be formed in the redistribution structure 112. If fewer dielectric layers and metallization patterns are to be formed, steps and process discussed below may be omitted. If more dielectric layers and metallization patterns are to be formed, steps and processes discussed below may be repeated. The fine-featured portion 112A and coarse-featured portion 112B of the redistribution structure 112 include metallization patterns and dielectric layers of differing sizes.

In FIG. 5, the fine-featured portion 112A of the redistribution structure 112 is formed. The fine-featured portion 112A of the redistribution structure 112 includes dielectric layers 114, 118, 122, and 126; and metallization patterns 116, 120, and 124. In some embodiments, the dielectric layers 118, 122 and 126 are formed from a same dielectric material, and are formed to a same thickness. Likewise, in some embodiments, the conductive features of the metallization patterns 116, 120 and 124 are formed from a same conductive material, and are formed to a same thickness. In particular, the dielectric layers 118, 122 and 126 have a first thickness $T_1$ that is small, such as in the range of about 7 μm to about 50 μm, and the conductive features of the metallization patterns 116, 120 and 124 have a second thickness $T_2$ that is small, such as in the range of about 2 μm to about 20 μm.

As an example of forming the fine-featured portion 112A of the redistribution structure 112, the dielectric layer 114 is deposited on the encapsulant 110, dielectric layers 58, and die connectors 56. In some embodiments, the dielectric layer 114 is formed of a photo-sensitive material such as PBO, polyimide, BCB, or the like, which may be patterned using a lithography mask. The dielectric layer 114 may be formed by spin coating, lamination, CVD, the like, or a combination thereof. The dielectric layer 114 is then patterned. The patterning forms openings exposing portions of the die connectors 56. The patterning may be by an acceptable process, such as by exposing the dielectric layer 114 to light when the dielectric layer 114 is a photo-sensitive material or by etching using, for example, an anisotropic etch. If the dielectric layer 114 is a photo-sensitive material, the dielectric layer 114 can be developed after the exposure.

The metallization pattern 116 is then formed. The metallization pattern 116 has line portions (also referred to as conductive lines or traces) on and extending along the major surface of the dielectric layer 114, and has via portions (also referred to as conductive vias) extending through the dielectric layer 114 to physically and electrically couple the die connectors 56 of the integrated circuit dies 50. As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 118 is then deposited on the metallization pattern 116 and dielectric layer 114. The dielectric layer 118 may be formed in a similar manner and of a similar material as the dielectric layer 114. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 116.

The dielectric layer 122 is then deposited on the metallization pattern 120 and dielectric layer 118. The dielectric layer 122 may be formed in a similar manner and of a similar material as the dielectric layer 114. The metallization pattern 124 is then formed. The metallization pattern 124 has line portions on and extending along the major surface of the dielectric layer 122, and has via portions extending through the dielectric layer 122 to physically and electrically couple the metallization pattern 120. The metallization pattern 124 may be formed in a similar manner and of a similar material as the metallization pattern 116.

The dielectric layer 126 is deposited on the metallization pattern 124 and dielectric layer 122. The dielectric layer 126 may be formed in a similar manner and of a similar material as the dielectric layer 114.

In FIG. 6, the coarse-featured portion 112B of the redistribution structure 112 is formed. The coarse-featured portion 112B of the redistribution structure 112 includes dielectric layers 130, 134, and 138; and metallization patterns 128, 132, and 136. In some embodiments, the dielectric layers 130, 134, and 138 are formed from a same dielectric material, and are formed to a same thickness. Likewise, in some embodiments, the conductive features of the metallization patterns 128, 132, and 136 are formed from a same conductive material, and are formed to a same thickness. In particular, the dielectric layers 130, 134, and 138 have a third thickness $T_3$ that is large, such as in the range of about 7 µm to about 50 µm, and the conductive features of the metallization patterns 128, 132, and 136 have a fourth thickness $T_4$ that is large, such as in the range of about 2 µm to about 20 µm. The third thickness $T_3$ is greater than the first thickness $T_1$ (see FIG. 5), and the fourth thickness $T_4$ is greater than the second thickness $T_2$ (see FIG. 5).

As an example of forming the coarse-featured portion 112B of the redistribution structure 112, the metallization pattern 128 is formed. The metallization pattern 128 has line portions on and extending along the major surface of the dielectric layer 126, and has via portions extending through the dielectric layer 126 to physically and electrically couple the metallization pattern 124. As an example to form the metallization pattern 128, a seed layer is formed over the dielectric layer 126 and in the openings extending through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 128. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 128. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 130 is then deposited on the metallization pattern 128 and dielectric layer 126. In some embodiments, the dielectric layer 130 is formed of a photosensitive material such as PBO, polyimide, BCB, or the like, which may be patterned using a lithography mask. The dielectric layer 130 may be formed by spin coating, lamination, CVD, the like, or a combination thereof. The metallization pattern 132 is then formed. The metallization pattern 132 has line portions on and extending along the major surface of the dielectric layer 130, and has via portions extending through the dielectric layer 130 to physically and electrically couple the metallization pattern 128. The metallization pattern 132 may be formed in a similar manner and of a similar material as the metallization pattern 128.

The dielectric layer 134 is then deposited on the metallization pattern 132 and dielectric layer 130. The dielectric layer 134 may be formed in a similar manner and of a similar material as the dielectric layer 130. The metallization pattern 136 is then formed. The metallization pattern 136 has line portions on and extending along the major surface of the dielectric layer 134, and has via portions extending through the dielectric layer 134 to physically and electrically couple the metallization pattern 132. The metallization pattern 136 may be formed in a similar manner and of a similar material as the metallization pattern 128.

The dielectric layer 138 is deposited on the metallization pattern 136 and dielectric layer 134. The dielectric layer 138 may be formed in a similar manner and of a similar material as the dielectric layer 130.

In FIG. 7, UBMs 140 are formed for external connection to the redistribution structure 112. The UBMs 140 have bump portions on and extending along the major surface of the dielectric layer 138, and have via portions extending through the dielectric layer 138 to physically and electrically couple the metallization pattern 136. As a result, the UBMs 140 are electrically coupled to the integrated circuit dies 50. The UBMs 140 may be formed in a similar manner and of a similar material as the metallization pattern 136. In some embodiments, the UBMs 140 have a different size than the metallization patterns 116, 120, 124, 128, 132, and 136.

After formation, the outermost extent of the redistribution structure 112 extends a distance $D_1$ from the center of the package component 100. As noted above, the package component 100 is large. The distance $D_1$ is thus also large. For example, the distance $D_1$ can be in the range of about 50 mm to about 200 mm.

Figure 8:
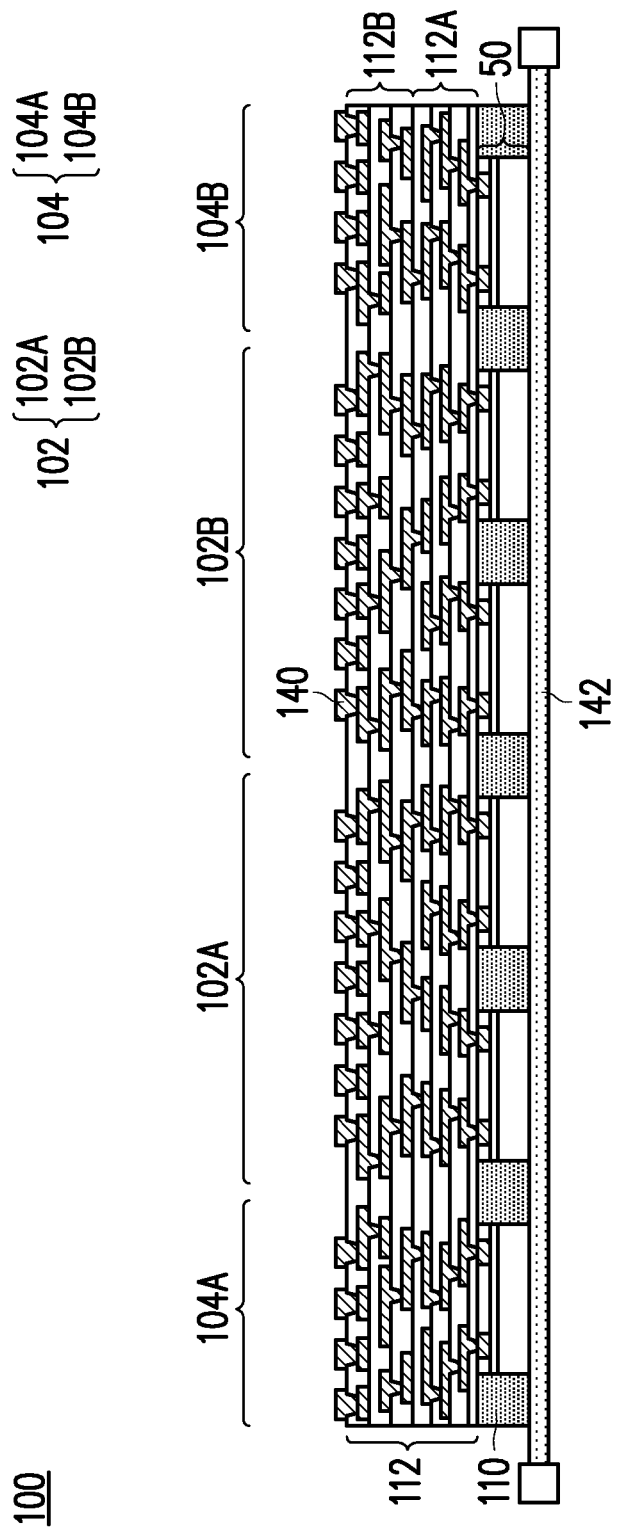

In FIG. 8, a carrier substrate debonding is performed to detach (or "debond") the carrier substrate 106 from the encapsulant 110 and integrated circuit dies 50. In some embodiments, the debonding includes removing the carrier substrate 106 and adhesive layer 108 by, e.g., a grinding or planarization process, such as a CMP. After removal, back side surfaces of the integrated circuit dies 50 are exposed, and the back side surfaces of the encapsulant 110 and integrated circuit dies 50 are level. The structure is then placed on a tape 142.

Figure 9:
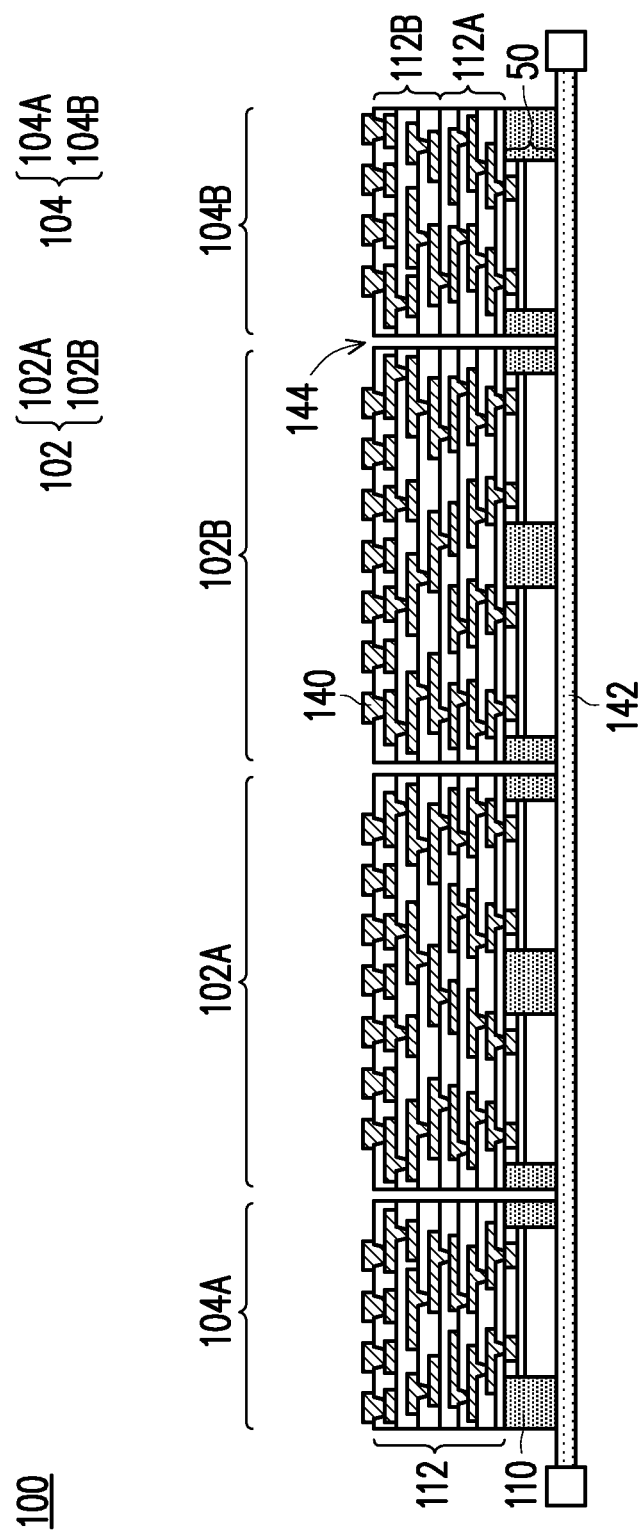

In FIG. 9, bolt holes 144 are formed through the package component 100. The bolt holes 144 may be formed by a drilling process such as laser drilling, mechanical drilling, or the like. The bolt holes 144 may be formed by drilling an outline for the bolt holes 144 with the drilling process, and then removing the material separated by the outline.

Figure 10:
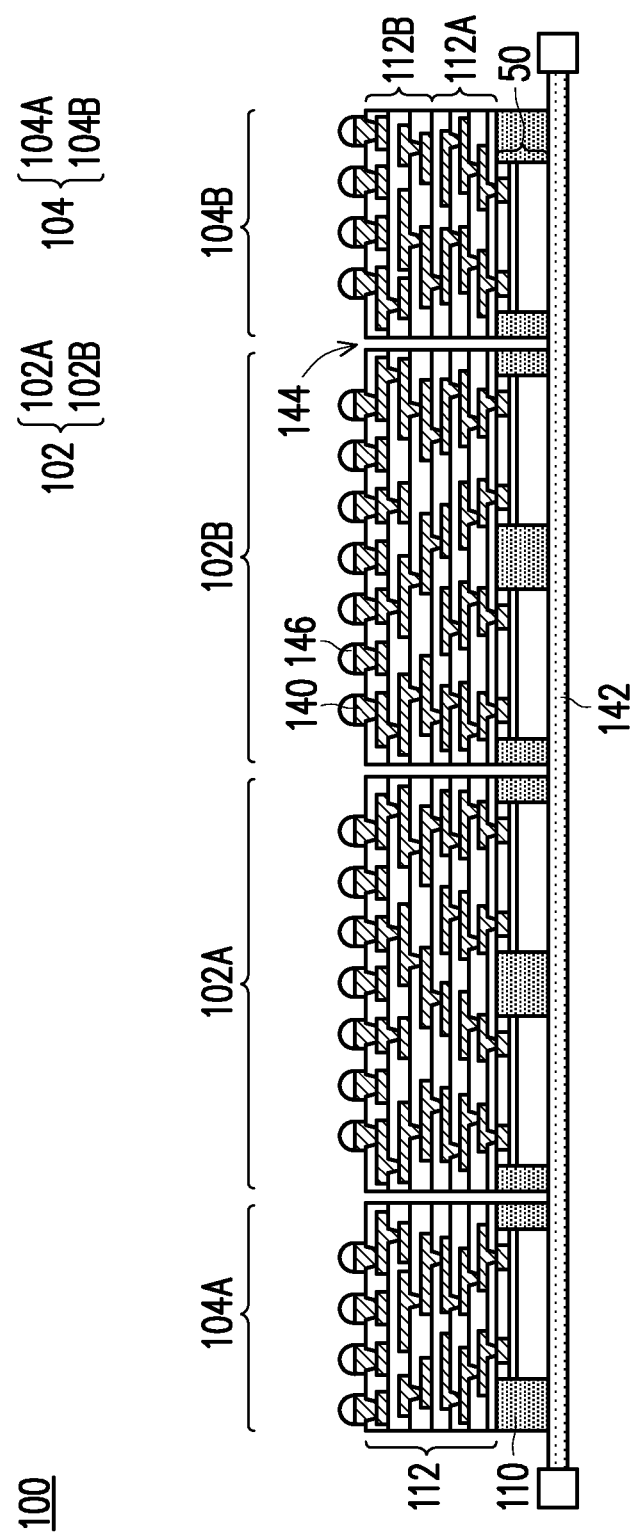

In FIG. 10, conductive connectors 146 are formed on the UBMs 140. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 11:
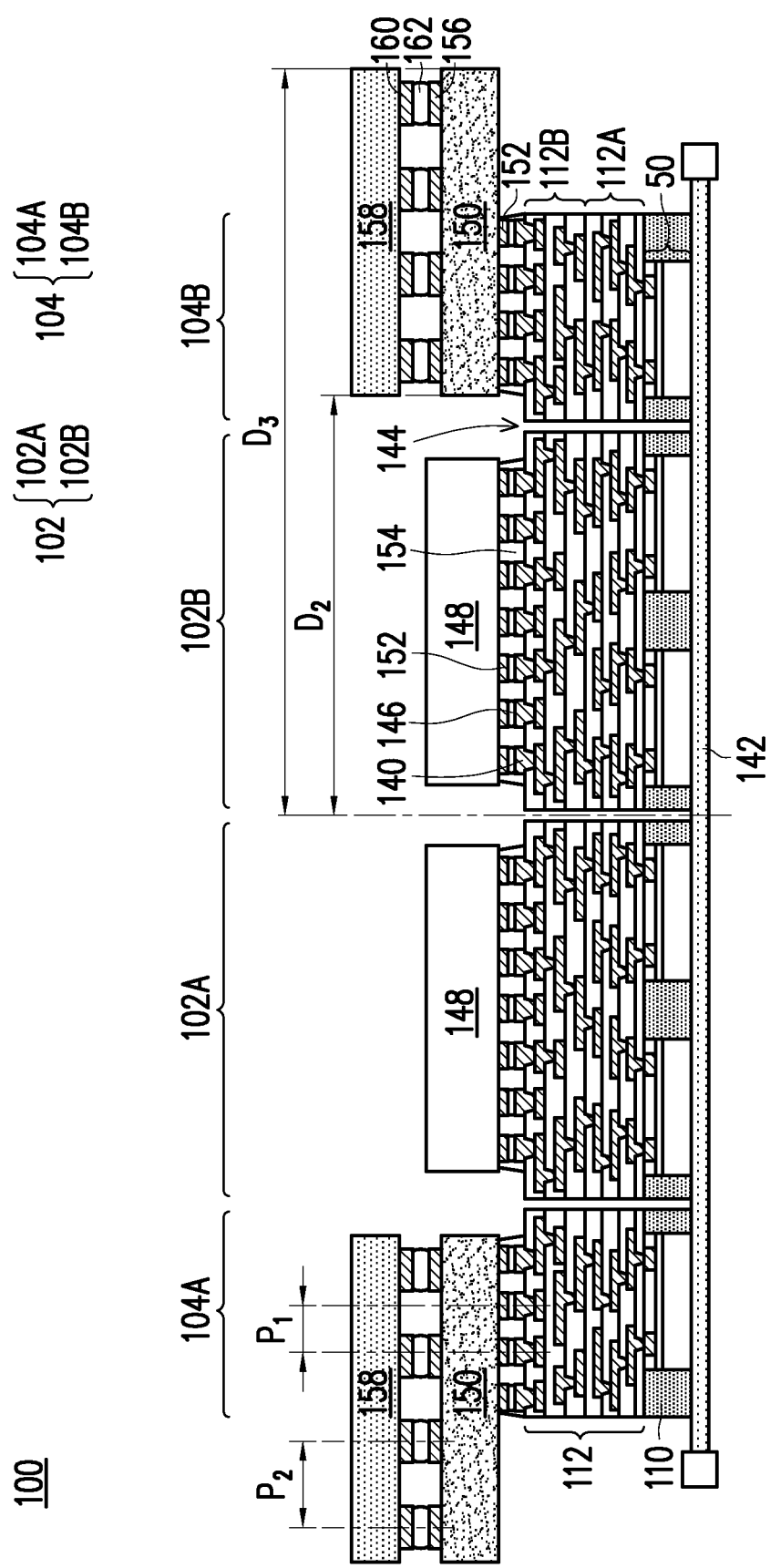

In FIG. 11, module sockets 148 and interposers 150 are attached to the redistribution structure 112. The module sockets 148 and interposers 150 are interfaces for external connection to the package component 100 (discussed further below). The module sockets 148 and interposers 150 include pads 152, such as aluminum pads, which are used for physical and electrical connection to the redistribution structure 112. The pads 152 of the module sockets 148 and interposers 150 may (or may not) have the same pitch $P_1$. For example, the pitch $P_1$ can be small, such as in the range of about 0.1 mm to about 1 mm. Attaching the module sockets 148 and interposers 150 may include placing the module sockets 148 and interposers 150 on the redistribution structure 112 using, e.g., a pick-and-place technique, and then reflowing the conductive connectors 146 to physically and electrically couple the pads 152 to the UBMs 140. Reflow of the conductive connectors 146 may be performed such that the module sockets 148 and interposers 150 are simultaneously attached to the redistribution structure 112. In the embodiment shown, the module sockets 148 are attached at the computing sites 102A and 102B, and the interposers 150 are attached at the connecting sites 104A and 104B. An underfill 154 may be formed to fill the gaps between the module sockets 148 and the redistribution structure 112. The underfill 154 may be formed by a capillary flow process after the module sockets 148 and interposers 150 are attached, or may be formed by a suitable deposition method before the module sockets 148 and interposers 150 are attached.

The module sockets 148 are electrical and physical interfaces for modules (discussed further below) that may be installed at the computing sites 102A and 102B subsequent to manufacture of the package component 100. For example, a user of the package component 100 may install modules in the module sockets 148 to form completed functional systems at the computing sites 102A and 102B. The type of modules selected for installation depends on the type of functional systems desired at the computing sites 102A and 102B. Examples of modules that may be installed in the module sockets 148 include memory modules, voltage regulator modules, power supply modules, integrated passive device (IPD) modules, and the like. The module sockets 148 may include different components, such as a chassis, the pads 152, and contact pins, which may comprise different materials.

The interposers 150 are electrical and physical interfaces for additional external connectors (discussed further below) to the connecting sites 104A and 104B. The interposers 150 may include, e.g., a core and one or more metallization layers disposed on opposing sides of the core for fanning in and fanning out electrical connections. Any quantity of metallization layers may be formed in the interposers 150. For example, the quantity of metallization layers in the interposers 150 can be in the range of 2 to 20. In addition to having the pads 152 at first sides facing the redistribution structure 112, the interposers 150 also have pads 156 at second sides that are opposite the first sides. The pads 156 have a pitch $P_2$, which is larger than the pitch $P_1$ of the pads 152. For example, the pitch $P_2$ can be large, such as in the range of about 0.5 mm to about 3 mm, such as about 0.8 mm.

The interposers 150 are placed along the periphery of the package component 100, with the outermost extents of the interposers 150 extending beyond the outermost extent of the redistribution structure 112. In particular, the interposers 150 are placed such that their inner edges are disposed a distance $D_2$ from the center of the package component 100, and their outer edges are disposed a distance $D_3$ from the center of the package component 100, where the distance $D_2$ is smaller than the distance $D_1$ (see FIG. 6), and the distance $D_3$ is larger than the distance $D_1$. For example, the distance $D_2$ can be in the range of about 35 mm to about 140 mm, and the distance $D_3$ can be in the range of about 65 mm to about 260 mm. In some embodiments, the distance $D_2$ can be at least half of the distance $D_1$. A majority of the area of the redistribution structure 112 may be unoccupied by the interposers 150, thereby increasing the area available for the module sockets 148.

Further, external connectors 158 are attached to the interposers 150. The external connectors 158 are electrical and physical interfaces for the package component 100 to external systems. For example, when the package component 100 is installed as part of a larger external system, such as a data center, the external connectors 158 may be used to couple the package component 100 to the external system. Examples of external connectors 158 include receptors for ribbon cables, flexible printed circuits, or the like. The external connectors 158 include pads 160, which may be similar to (and have the same pitch $P_2$ as) the pads 156. The external connectors 158 may include different components, such as a chassis, the pads 160, and external connection pins, which may comprise different materials. The external connectors 158 also include conductive connectors 162 on the pads 160, which may be similar to the conductive connectors 146. The pads 160 and conductive connectors 162 are used for physical and electrical connection to the interposers 150. Attaching the external connectors 158 may include placing the external connectors 158 on the interposers 150 using, e.g., a pick-and-place technique, and then reflowing the conductive connectors 162 to physically and electrically couple the pads 156 and pads 160. Because they are stacked on the interposers 150, the external connectors 158 are vertically offset from the module sockets 148 after being attached. The outermost extents of the external connectors 158 thus extend beyond the outermost extent of the redistribution structure 112. In some embodiments, the external connectors 158 only partially laterally overlap with the redistribution structure 112. In some embodiments, the external connectors 158 do not laterally overlap with the redistribution structure 112.

Some HPC systems may need a large quantity of external connections to external systems. For example, when the package component 100 is an AI accelerator, the connecting sites 104 may include thousands or tens of thousands of external connections. However, as noted above, the pads 160 of the external connectors 158 have a large pitch $P_2$. Use of the interposers 150 allows the external connectors 158 to extend beyond the outermost extent of the package component 100, thereby increasing the surface area available for the external connectors 158. More external connectors 158 may thus be included with the package component 100, thereby increasing the amount of available external connections.

Figure 12:
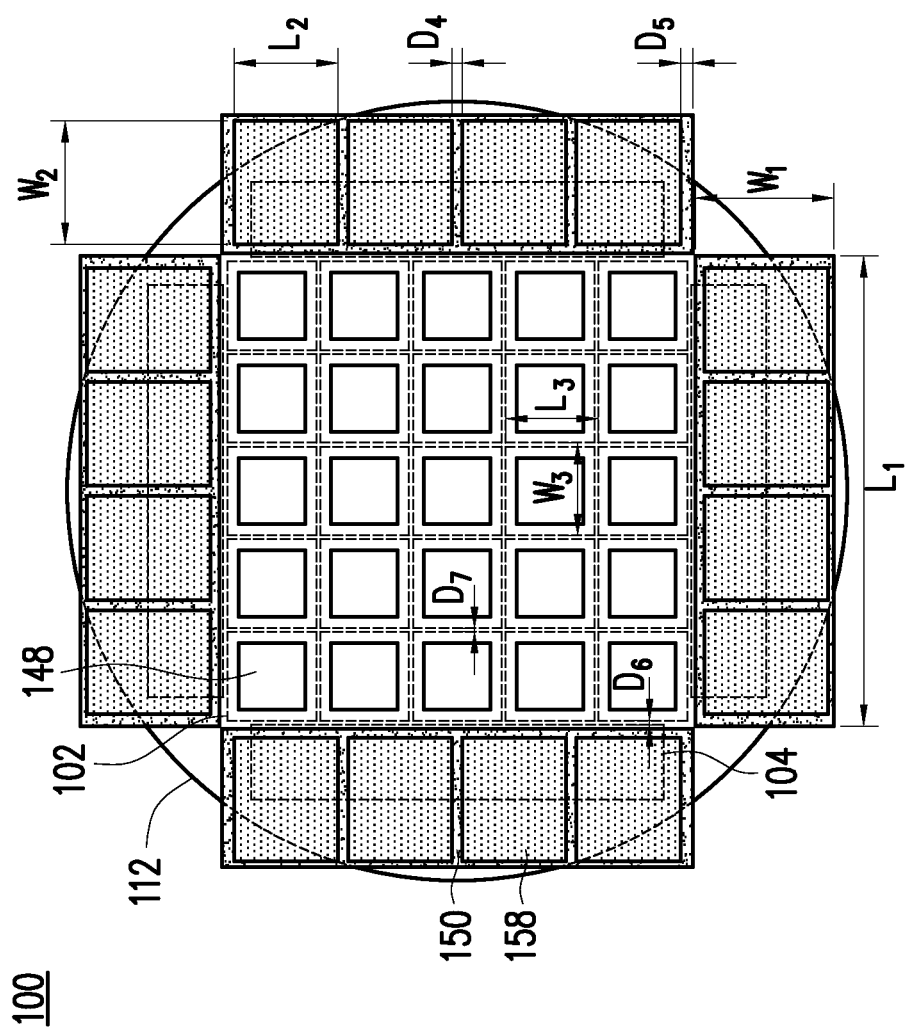
FIG. 12 is a top-down view of a package component, in accordance with some embodiments.

The module sockets 148 and external connectors 158 may be attached to the redistribution structure 112 in a variety of layouts. The cross-sectional views of FIGS. 2-11 show one example layout. FIG. 12 is a top-down view of the package component 100, in accordance with some embodiments. In this embodiment, the computing sites 102 are arranged in a grid that includes twenty-five computing sites 102, and four connecting sites 104 are disposed around the sides of the grid. Each one of the module sockets 148 directly overlies and is electrically coupled to the SoC dies 50A of a corresponding computing site 102. Each one of the interposers 150 directly overlies and is electrically coupled to the I/O interface dies 50B of one or more connecting sites 104. The interposers 150 and external connectors 158 extend beyond the outermost extent of the package component 100.

The interposers 150 have a width $W_1$ and a length $L_1$ in the top-down view. For example, the width $W_1$ can be in the range of about 15 mm to about 45.5 mm, and the length $L_1$ can be in the range of about 30 mm to about 250 mm. The external connectors 158 likewise have a width $W_2$ and a length $L_2$ in the top-down view, with the width $W_2$ being less than the width $W_1$, and the length $L_2$ being less than the length $L_1$. For example, the width $W_2$ can be in the range of about 10 mm to about 32 mm, and the length $L_2$ can be in the range of about 20 mm to about 245 mm. Further, the external connectors 158 are spaced apart from one another in the top-down view by a distance $D_4$, and are spaced apart from edges of the interposers 150 in the top-down view by a distance $D_5$. For example, the distance $D_4$ can be in the range of about 0.2 mm to about 2 mm, and the distance $D_5$ can be in the range of about 0.2 mm to about 2 mm. Further, the computing sites 102 can have a width $W_3$ and a length $L_3$ in the top-down view. For example, the width $W_3$ can be in the range of about 15 mm to about 36.67 mm, and the length $L_3$ can be in the range of about 15 mm to about 36.67 mm. Further, the computing sites 102 are spaced apart from one another in the top-down view by a distance $D_6$, and are spaced apart from the connecting sites 104 in the top-down view by a distance $D_7$. For example, the distance $D_6$ can be in the range of about 0.1 mm to about 0.5 mm, and the distance $D_7$ can be in the range of about 0.1 mm to about 0.5 mm.

The module sockets 148, interposers 150, and external connectors 158 may be attached to the redistribution structure 112 with several techniques. As discussed further below, in some embodiments, the module sockets 148, interposers 150, and external connectors 158 are attached by the use of adjustable jig, which allows the interposers 150 to be supported before they are physically coupled to the redistribution structure 112. Other techniques may also be used to attach the module sockets 148, interposers 150, and external connectors 158.

Figure 13:
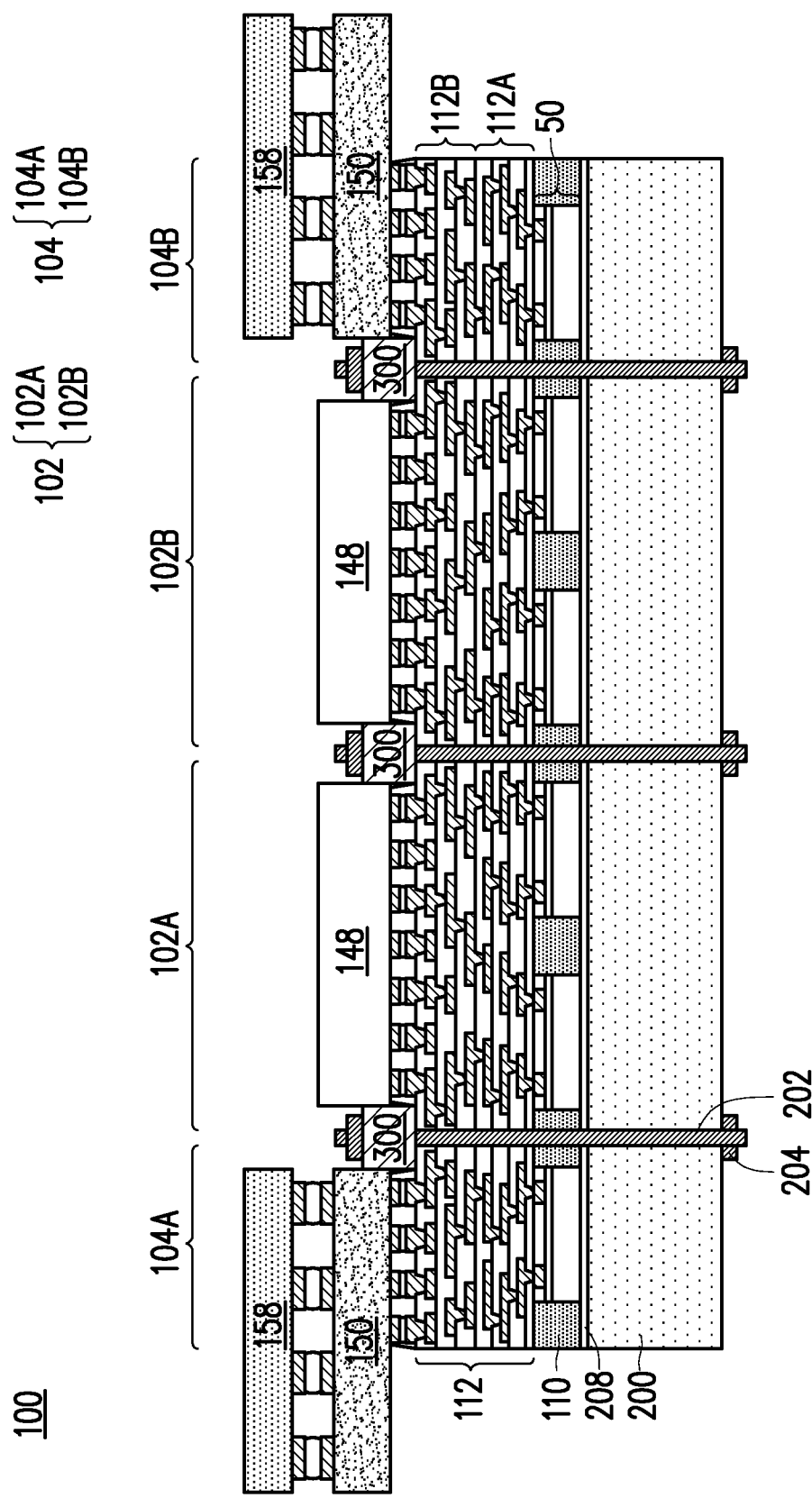
FIG. 13 illustrates a cross-sectional view of a system-on-wafer assembly, in accordance with some embodiments.

FIG. 13 illustrates a cross-sectional view of a system-on-wafer assembly, in accordance with some embodiments. The system-on-wafer assembly is formed by securing the package component 100 between a thermal module 200 and a mechanical brace 300. The thermal module 200 may be a heat sink, a heat spreader, a cold plate, or the like. The mechanical brace 300 is a rigid support that may be formed from a material with a high stiffness, such as a metal, e.g., steel, titanium, cobalt, or the like. The mechanical brace 300 physically engages portions of the redistribution structure 112. Warpage of the package component 100, such as that induced by carrier substrate debonding, may be reduced by clamping the package component 100 between the thermal module 200 and mechanical brace 300. The mechanical brace 300 is a grid that has openings exposing portions of the module sockets 148, for ease of module installation.

The package component 100 is removed from the tape 142 and is fastened between the thermal module 200 and mechanical brace 300 with bolts 202. The bolts 202 are threaded through the bolt holes 144 of the package component 100, through corresponding bolt holes in the thermal module 200, and through corresponding bolt holes in the mechanical brace 300. Fasteners 204 are threaded onto the bolts 202 and tightened to clamp the package component 100 between the thermal module 200 and mechanical brace 300. The fasteners 204 may be, e.g., nuts that thread to the bolts 202. The fasteners 204 attach to the bolts 202 at both sides of the system-on-wafer assembly (e.g., at the side having the thermal module 200 (sometimes referred to as the back side) and at the side having the mechanical brace 300 (sometimes referred to as the front side)). After being attached, portions of the mechanical brace 300 are disposed between the module sockets 148, and between the module sockets 148 and interposers 150.

Before fastening together the various components, a thermal interface material (TIM) 208 may be dispensed on the back side of the package component 100, physically and thermally coupling the thermal module 200 to the integrated circuit dies 50. In some embodiments, the TIM 206 is formed of a film comprising indium and a HM03 type material. During fastening, the fasteners 204 are tightened, thereby increasing the mechanical force applied to the package component 100 by the thermal module 200 and the mechanical brace 300. The fasteners 204 are tightened until the thermal module 200 exerts a desired amount of pressure on the TIM 206.

Figure 14:
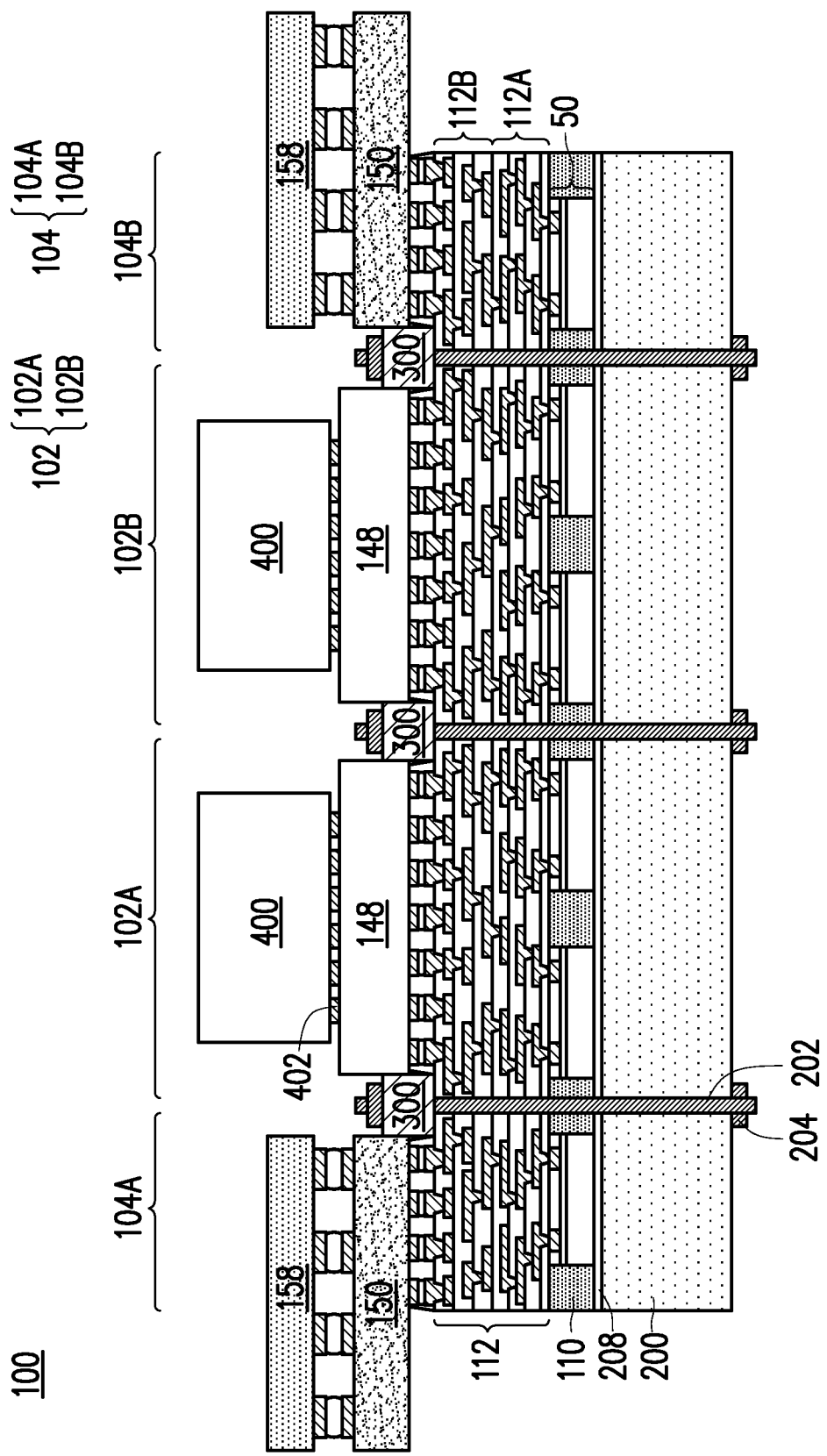
FIG. 14 illustrates a cross-sectional view of module installation in a system-on-wafer assembly, in accordance with some embodiments.

FIG. 14 illustrates a cross-sectional view of a system-on-wafer assembly after modules 400 are installed in the module sockets 148. As noted above, the modules 400 may be memory modules, voltage regulator modules, power supply modules, integrated passive device (IPD) modules, or the like. The modules 400 comprise conductive connectors 402, which are inserted in corresponding receptors to physically and electrically couple the contact pins of the module sockets 148. The modules 400 are thus secured in the module sockets 148, forming completed functional systems at the computing sites 102A and 102B.

Figure 15A:
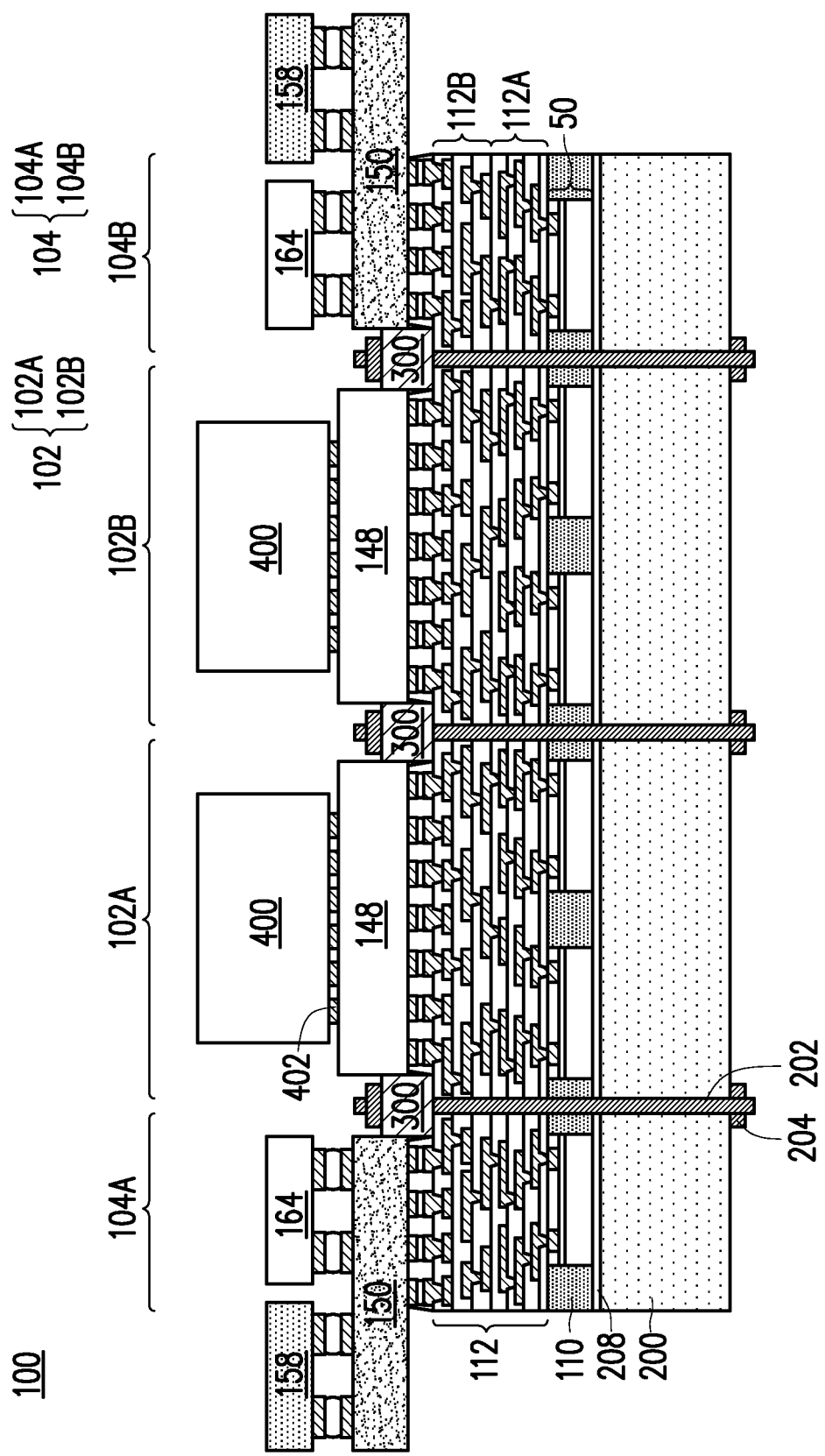
FIGS. 15A, 15B, 15C, and 15D illustrate cross-sectional views of system-on-wafer assemblies, in accordance with other embodiments.
Figure 15B:
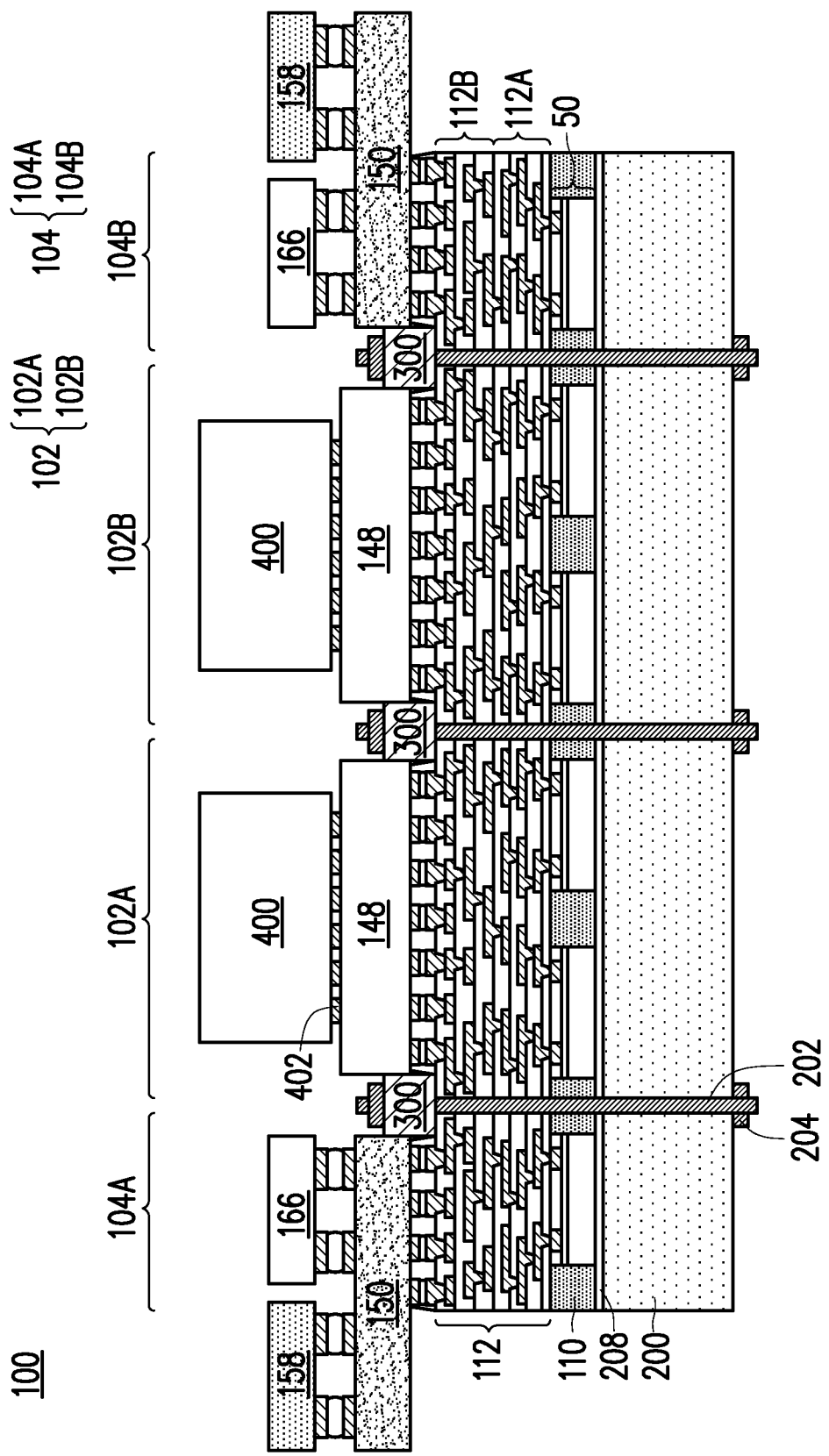
Figure 15C:
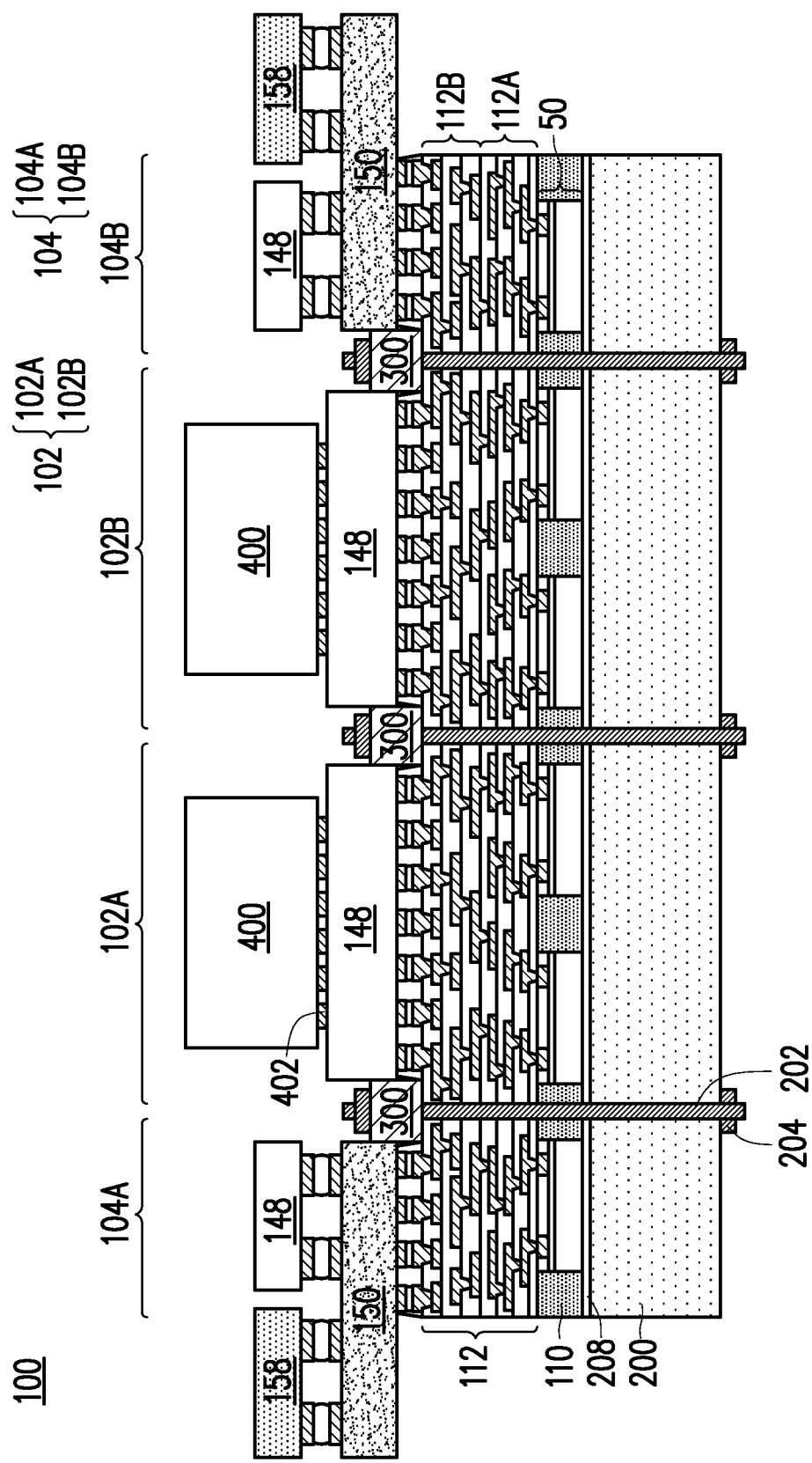
Figure 15D:
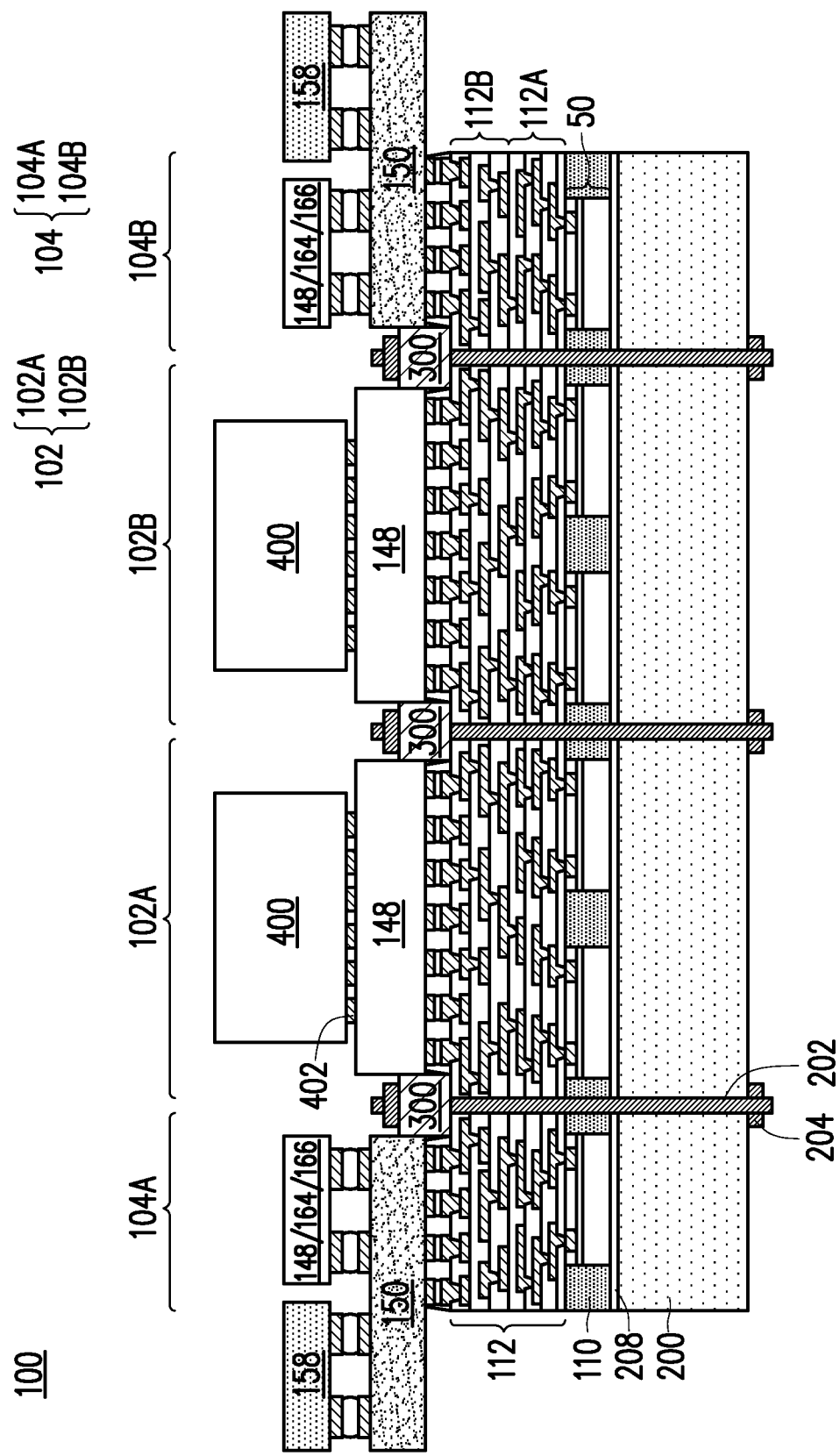

FIGS. 15A, 15B, 15C, and 15D illustrate cross-sectional views of system-on-wafer assemblies, in accordance with other embodiments. In these embodiments, other features are attached to the interposers 150, in addition to the external connectors 158. In FIG. 15A, device modules 164 are attached to the interposers 150, adjacent the external connectors 158. In FIG. 15B, passive devices 166 are attached to the interposers 150, adjacent the external connectors 158. In FIG. 15C, additional module sockets 148 for modules 400 (see FIG. 14) are attached to the interposers 150, adjacent the external connectors 158. In FIG. 15D, a combination of device modules 164, passive devices 166, and module sockets 148 are attached to the interposers 150, adjacent the external connectors 158. Any desired combination of connectors and modules may be attached to the interposers 150.

The device modules 164 may be include several types of devices. The device modules 164 may include active devices. For example, the device modules 164 may be logic devices, memory devices, power management devices, radio frequency (RF) devices, signal processing devices, front-end devices, application-specific devices, I/O devices, the like, or combinations thereof. The device modules 164 may be dies, multi-chip modules (MCMs), fan-out packages, chip-scale packages, or the like, and may be connected to the interposers 150 by flip-chip connections, wire bonds, or the like.

The passive devices 166 may include several types of devices. For example, the passive devices 166 may be resistors such as film resistors, inductors such as coil inductors, capacitors such as metal electrode multilayered ceramic chip (MLCC) capacitors, or the like. The passive devices 166 may be discrete passive devices, or may be integrated passive devices (IPDs).

FIGS. 16A-19B are various views of intermediate steps during a process for attaching the module sockets 148, interposers 150, and external connectors 158 to the package component 100, in accordance with some embodiments. The illustrated process may be performed, for example, during the intermediate step described above with respect to FIG. 11. FIGS. 16A, 17A, 18A, and 19A are cross-sectional views illustrating a single computing site 102A and a single connecting site 104A at an edge of a package component 100. FIGS. 16B, 17B, 18B, and 19B are top-down views corresponding to the respective cross-sectional views of the package component 100.

Figure 16A:
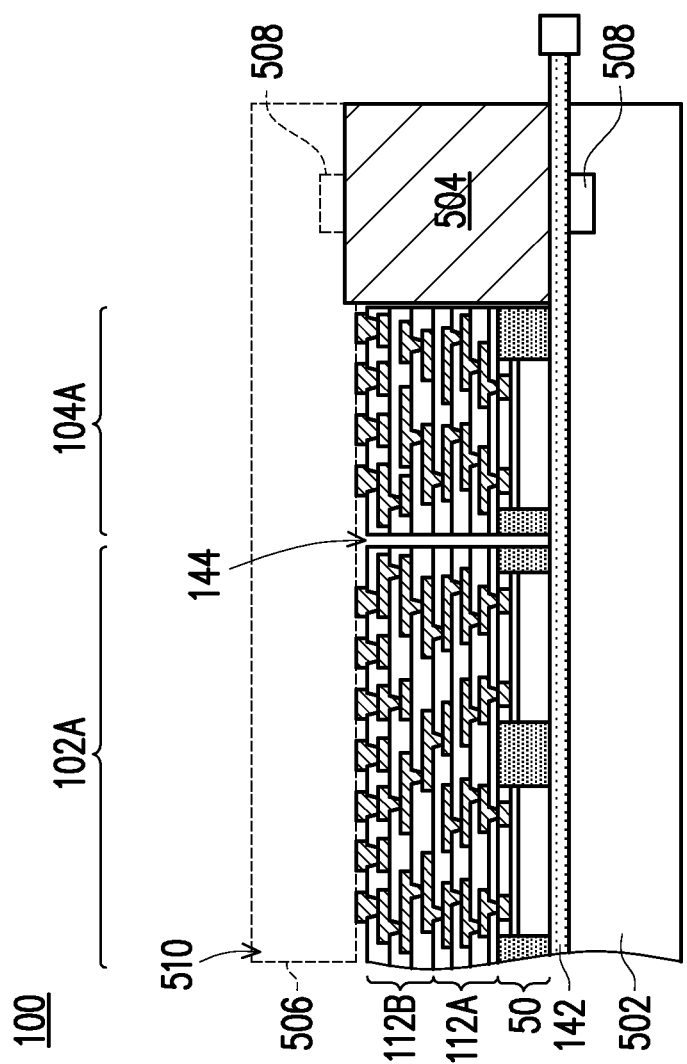
FIGS. 16A-19B are various views of intermediate steps during a process for attaching an interposer to a package component, in accordance with some embodiments.
Figure 16B:
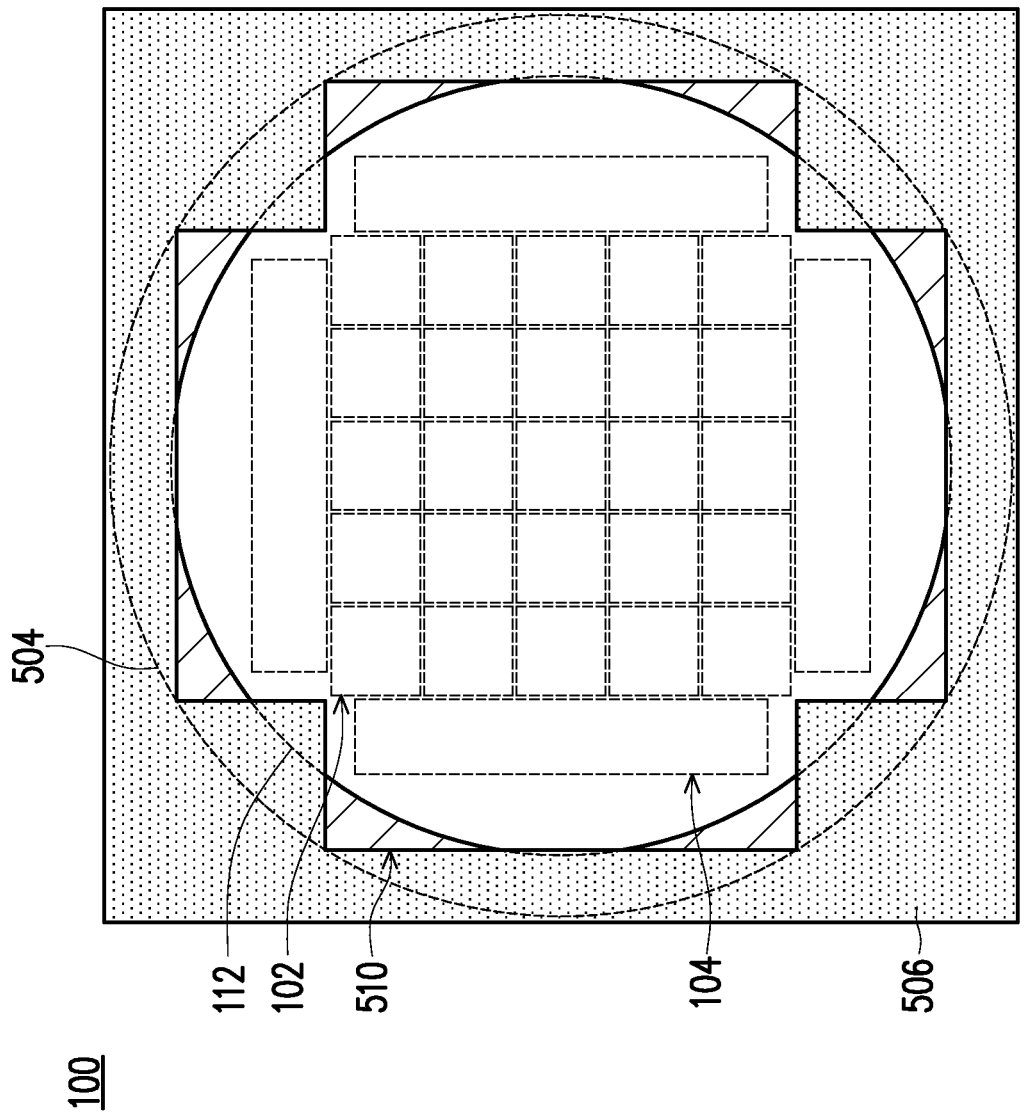

In FIGS. 16A and 16B, an adjustable jig is assembled around the package component 100. The adjustable jig secures the package component 100 in place, and sandwiches it together to reduce wafer warpage during reflowing operations (discussed further below). The adjustable jig includes a bottom jig portion 502, a middle jig portion 504, and a top jig portion 506. The bottom jig portion 502, middle jig portion 504, and top jig portion 506 may be formed of metal, such as steel, titanium, cobalt, or the like. The bottom jig portion 502 is placed below the tape 142, and may be used to support the package component 100 in subsequent processing. The middle jig portion 504 is placed around the package component 100, and laterally secures the package component 100 in subsequent processing. The top jig portion 506 is placed over the package component 100, and clamps the package component 100 to reduce wafer warpage in subsequent processing. The bottom jig portion 502 and top jig portion 506 together include a pair of magnets 508. The magnets 508 hold the bottom jig portion 502 and top jig portion 506 together, and are also used to adjust the middle jig portion 504 during the attaching of the interposers 150 (discussed further below). The magnets 508 may be electromagnets that are coupled to and controlled by a current source (not shown). The middle jig portion 504 is formed of a material that is magnetically attracted to the magnetic field produced by the magnets 508. The position of the middle jig portion 504 may thus be changed by adjusting the amount of electric current that flows through the magnets 508 in the bottom jig portion 502 and/or the top jig portion 506. The top jig portion 506 also includes an opening 510. The opening 510 in the top jig portion 506 exposes the computing sites 102 and connecting site 104 of the package component 100 after the adjustable jig is assembled.

Figure 17A:
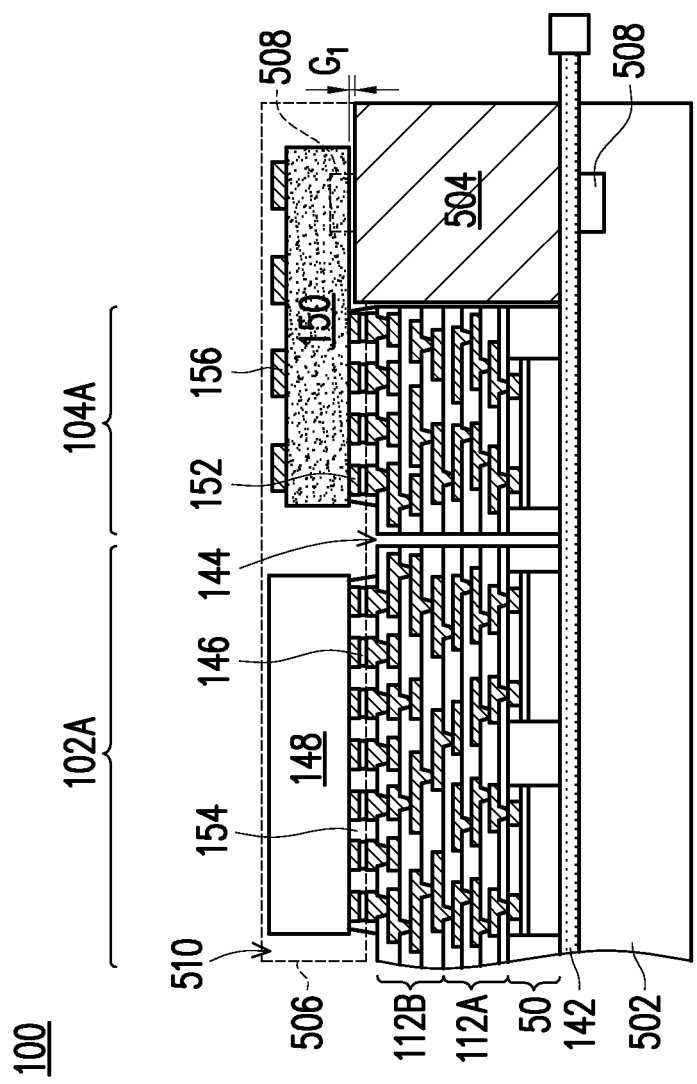
Figure 17B:
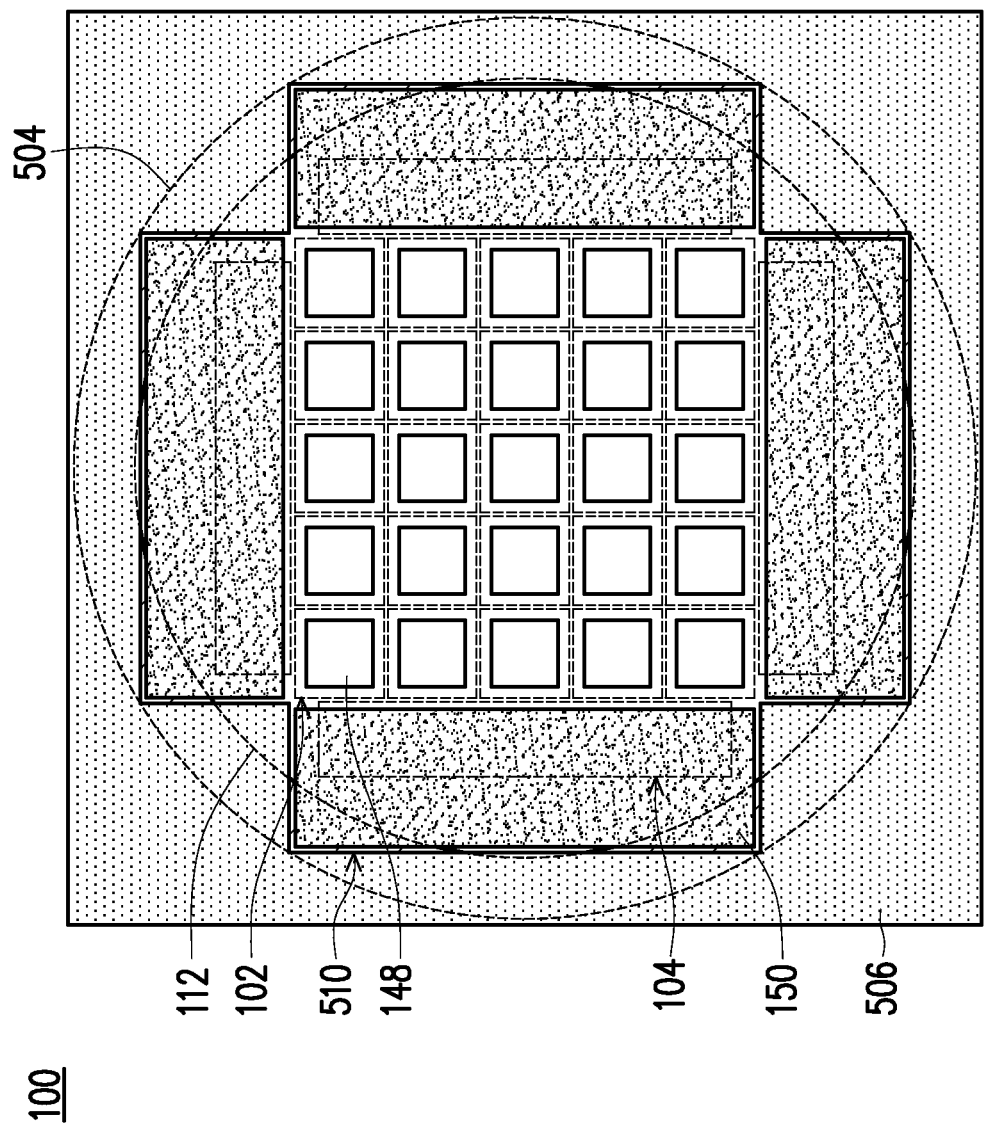

In FIGS. 17A and 17B, the module sockets 148 and interposers 150 are attached to the redistribution structure 112. As discussed above, attaching the module sockets 148 and interposers 150 may include placing the module sockets 148 and interposers 150 on the redistribution structure 112, and then reflowing the conductive connectors 146. The module sockets 148 and interposers 150 are placed in the opening 510 of the top jig portion 506, on the portions of the redistribution structure 112 exposed by the opening 510. Notably, the interposers 150 may be placed over the redistribution structure 112 and the middle jig portion 504. After placement, some portions of the interposers 150 laterally extend beyond the outermost extent of the redistribution structure 112 and over the middle jig portion 504, and other portions of the interposers 150 are laterally confined within the outermost extent of the redistribution structure 112.

During placement, the middle jig portion 504 may be adjusted to reduce the gap $G_1$ between the middle jig portion 504 and the interposers 150. In particular, the middle jig portion 504 may be adjusted to eliminate or at least reduce the gap $G_1$, such that the interposers 150 are substantially level and contact all desired conductive connectors 146. In some embodiments, the middle jig portion 504 has sufficient throw to allow the gap $G_1$ to be adjusted by up to 10 μm in each direction. Adjusting of the middle jig portion 504 may be accomplished with the magnets 508 by changing the amount of electric current supplied to the magnets 508. The interposers 150 may thus be supported by the middle jig portion 504 after they are placed and before reflow occurs. After reflowing the conductive connectors 146, the module sockets 148 and interposers 150 are simultaneously attached to the redistribution structure 112. The underfill 154 may be formed before or after the module sockets 148 and interposers 150 attached.

Figure 18A:
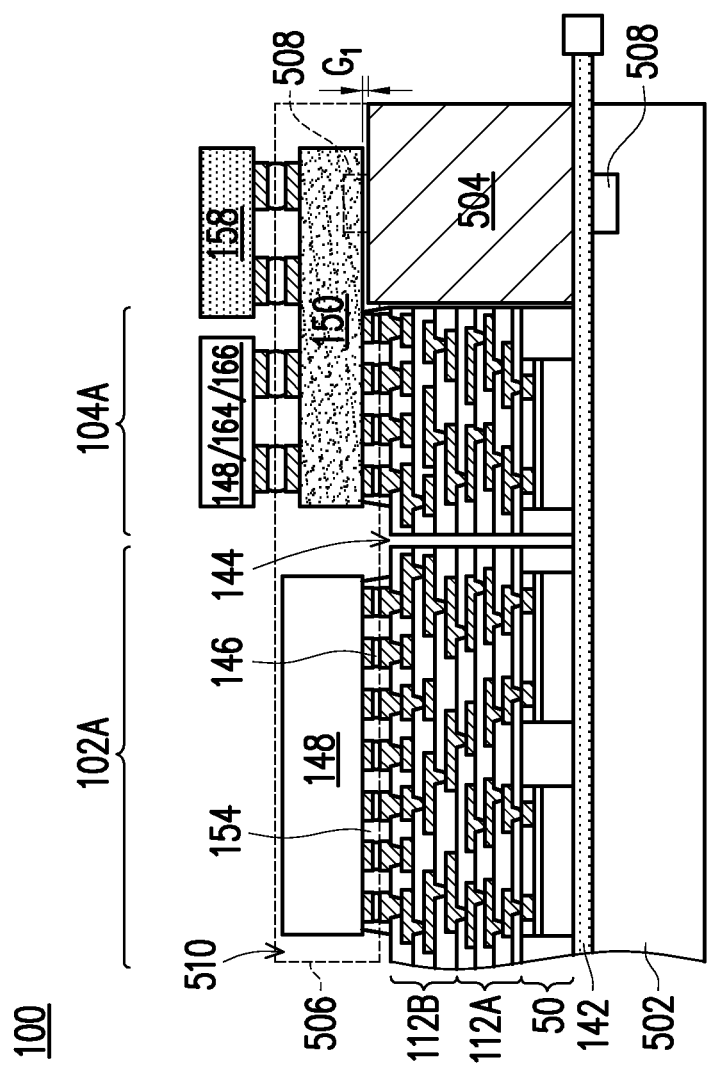
Figure 18B:
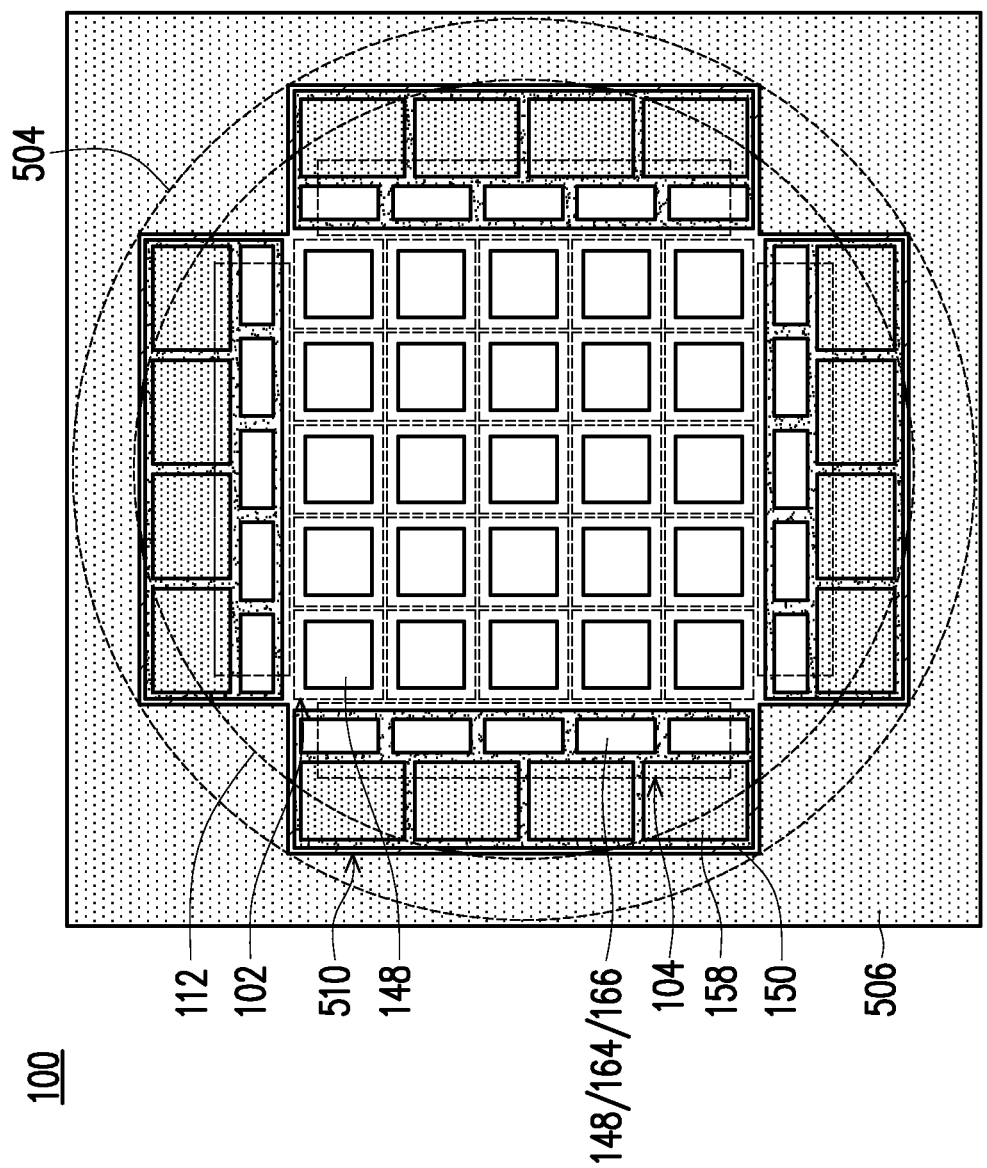

In FIGS. 18A and 18B, the external connectors 158 are attached to the interposers 150. Further, module sockets 148, device modules 164, and/or passive devices 166 may also be attached to the interposers 150. As discussed above, attaching the external connectors 158, module sockets 148, device modules 164, and/or passive devices 166 may include placing them on the interposers 150, and then reflowing the conductive connectors 162.

Figure 19A:
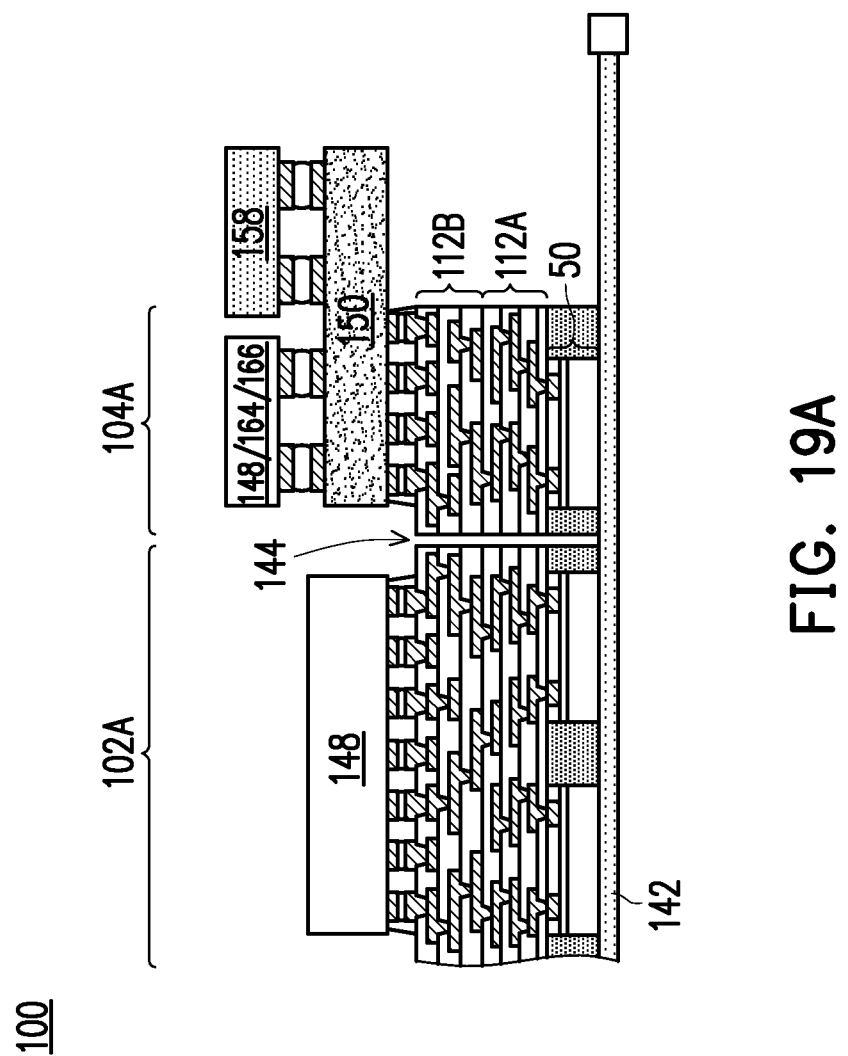
Figure 19B:
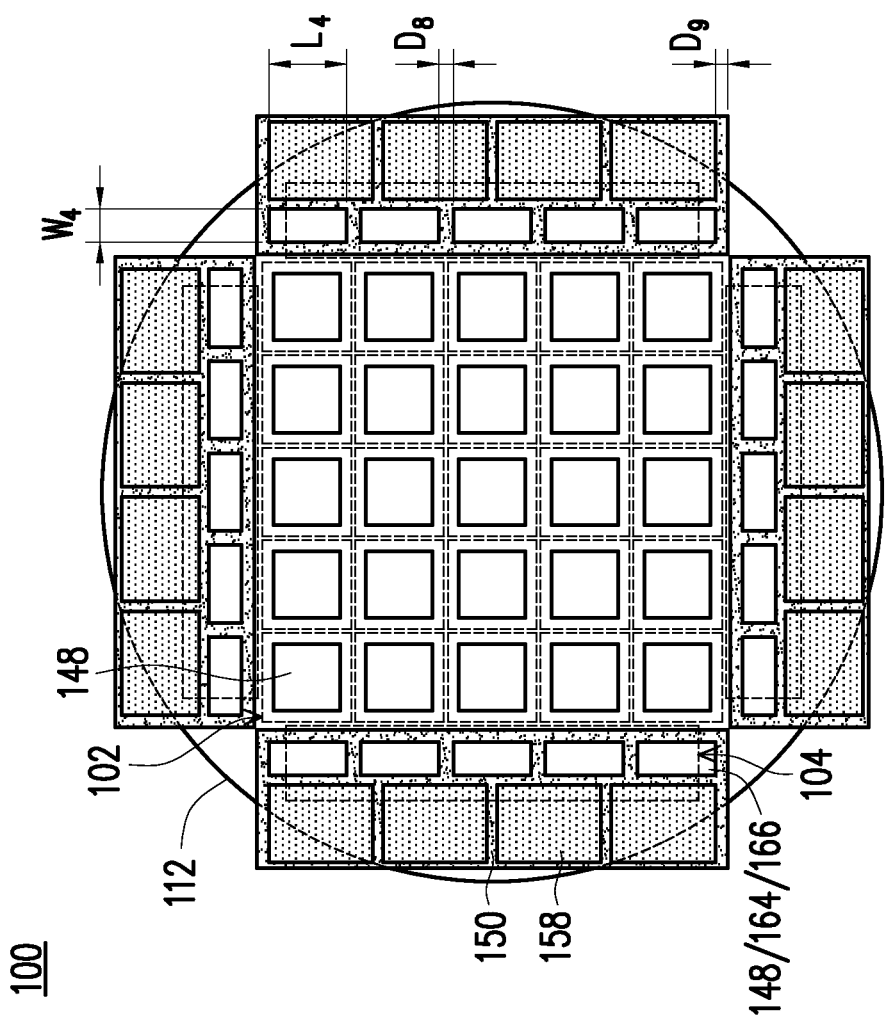

In FIGS. 19A and 19B, the adjustable jig is removed, including the bottom jig portion 502, middle jig portion 504, and top jig portion 506. Because the components of the adjustable jig are held together by the magnets 508, removal may be accomplished by pulling apart the bottom jig portion 502 and top jig portion 506 until the forces of the magnets 508 are overcome.

When the module sockets 148, device modules 164, and/or passive devices 166 are attached to the interposers 150, they can have a width $W_4$ and a length $L_4$ in the top-down view. For example, the width $W_4$ can be in the range of about 3 mm to about 9.5 mm, and the length $L_4$ can be in the range of about 10 mm to about 30.8 mm. The width $W_4$ can be less than the width $W_2$ (see FIG. 12), and the length $L_4$ can be less than the length $L_2$ (see FIG. 12). Further, the module sockets 148, device modules 164, and/or passive devices 166 on the interposers 150 are spaced apart from one another in the top-down view by a distance $D_8$, and are spaced apart from edges of the interposers 150 in the top-down view by a distance $D_9$. For example, the distance $D_8$ can be in the range of about 0.1 mm to about 0.5 mm, and the distance $D_9$ can be in the range of about 0.2 mm to about 2 mm.

Embodiments may achieve advantages. As noted above, the connecting sites 104 may include thousands or tens of thousands of external connections, depending on the type of system implementing the package component 100. Use of the interposers 150 allows the external connectors 158 to extend beyond the outermost extent of the package component 100, thereby increasing the surface area available for the external connectors 158. More external connectors 158 may thus be included, allowing more external connections to be included with the package component 100.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a device includes: a package component including: a first integrated circuit die; an encapsulant at least partially surrounding the first integrated circuit die; a redistribution structure on the encapsulant, the redistribution structure physically and electrically coupling the first integrated circuit die; a first module socket attached to the redistribution structure; an interposer attached to the redistribution structure adjacent the first module socket, the outermost extent of the interposer extending beyond the outermost extent of the redistribution structure; and an external connector attached to the interposer.

In some embodiments of the device, the interposer includes first pads on a first side of the interposer, and second pads on a second side of the interposer, the first pads physically and electrically coupling the redistribution structure, the second pads physically and electrically coupling the external connector, the first pads having a first pitch, the second pads having a second pitch, the second pitch being greater than the first pitch. In some embodiments of the device, the first pitch is in a range of 0.1 mm to 1 mm, and the second pitch is in a range of 0.5 mm to 3 mm. In some embodiments of the device, the interposer includes metallization layers, a quantity of the metallization layers being in a range of 2 to 20. In some embodiments of the device, the outermost extent of the redistribution structure is disposed a first distance from a center of the package component, an inner edge of the interposer is disposed a second distance from the center of the package component, and an outer edge of the interposer is disposed a third distance from the center of the package component, the second distance being less than the first distance, the third distance being greater than the first distance. In some embodiments of the device, the second distance is at least half of the first distance. In some embodiments of the device, the package component further includes: a second integrated circuit die attached to the interposer adjacent the external connector. In some embodiments of the device, the package component further includes: a passive device attached to the interposer adjacent the external connector. In some embodiments of the device, the package component further includes: a second module socket attached to the interposer adjacent the external connector. In some embodiments of the device, the interposer is one of a plurality of interposers attached to the redistribution structure, each of the interposers having an outermost extent extending beyond the outermost extent of the redistribution structure. In some embodiments, the device further includes: a thermal interface material on a back-side surface of the first integrated circuit die; and a thermal module thermally and physically coupled to the back-side surface of the first integrated circuit die with the thermal interface material. In some embodiments, the device further includes: a mechanical brace, the package component being disposed between the thermal module and the mechanical brace; and a bolt extending through the mechanical brace, the package component, and the thermal module. In some embodiments of the device, the package component further includes: an underfill disposed between the interposer and the redistribution structure.

In an embodiment, a method includes: forming a package component including a first integrated circuit die, a redistribution structure physically and electrically coupled to the first integrated circuit die, and conductive connectors physically and electrically coupled to the redistribution structure; assembling a jig around the package component; placing an interposer over the package component and the jig, the jig supporting a first portion of the interposer; adjusting the jig to reduce a gap between the jig and the first portion of the interposer; reflowing the conductive connectors to physically and electrically couple the interposer to the redistribution structure; and removing the jig.

In some embodiments of the method, after removing the jig, the first portion of the interposer laterally extends beyond an outermost extent of the redistribution structure, and a second portion of the interposer is laterally confined within the outermost extent of the redistribution structure. In some embodiments of the method, the jig includes a bottom portion supporting the package component, a top portion having an opening exposing the package component, and a middle portion disposed between the top portion and the bottom portion. In some embodiments of the method, adjusting the jig includes moving the middle portion by adjusting a magnetic field. In some embodiments of the method, placing the interposer over the package component and the jig includes placing the interposer in the opening of the top portion of the jig.

In an embodiment, a method includes: placing integrated circuit dies on a carrier substrate; encapsulating the integrated circuit dies with an encapsulant; forming a redistribution structure over the encapsulant and the integrated circuit dies, the outermost extent of the redistribution structure being disposed a first distance from a center of the redistribution structure; attaching a module socket to the redistribution structure; attaching an interposer to the redistribution structure adjacent the module socket, an inner edge of the interposer being disposed a second distance from the center of the redistribution structure, an outer edge of the interposer being disposed a third distance from the center of the redistribution structure, the second distance being less than the first distance, the third distance being greater than the first distance; and attaching an external connector to the interposer.

In some embodiments of the method, the second distance is at least half of the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a package component comprising:
  first integrated circuit dies;
  a redistribution structure on the first integrated circuit dies, an outer edge of the redistribution structure being disposed a first distance from a center of the redistribution structure in a cross-sectional view;
  first sockets attached to the redistribution structure, the first sockets arranged in a grid in a top-down view; and
  interposers attached to the redistribution structure, the interposers disposed around the grid of the first sockets in the top-down view, an inner edge of each of the interposers being disposed a second distance from the center of the redistribution structure in the cross-sectional view, an outer edge of each of the interposers being disposed a third distance from the center of the redistribution structure in the cross-sectional view, the second distance being less than the first distance, the third distance being greater than the first distance.

2. The device of claim 1, wherein the first sockets have different widths than the interposers in the top-down view, and the first sockets have different lengths than the interposers in the top-down view.

3. The device of claim 1, wherein the second distance is at least half of the first distance.

4. The device of claim 1, wherein the package component further comprises:
external connectors attached to the interposers, the external connectors vertically offset from the first sockets.

5. The device of claim 4, wherein the interposers comprise first pads connected to the redistribution structure and further comprise second pads connected to the external connectors, the first pads and the second pads having different pitches.

6. The device of claim 1, wherein the first sockets comprise first pads connected to the redistribution structure, the interposers comprise second pads connected to the redistribution structure, and the first pads and the second pads have a same pitch.

7. The device of claim 1, wherein the first sockets comprise first pads connected to the redistribution structure, the interposers comprise second pads connected to the redistribution structure, and the first pads and the second pads have different pitches.

8. The device of claim 1 further comprising:
a mechanical brace having openings exposing portions of the first sockets; and
a thermal module, the package component being disposed between the thermal module and the mechanical brace.

9. The device of claim 8 further comprising:
bolts extending through the thermal module, the package component, and the mechanical brace.

10. A device comprising:
a package component comprising:
an integrated circuit die;
an encapsulant at least partially surrounding the integrated circuit die;
a redistribution structure on the encapsulant, the redistribution structure connected to the integrated circuit die;
a module socket comprising first pads connected to the redistribution structure;
a plurality of interposers attached to the redistribution structure, the interposers disposed around the module socket in a top-down view; and
an external connector comprising second pads connected to an interposer of the interposers, the second pads having a greater pitch than the first pads.

11. The device of claim 10, wherein an outer edge of the interposer extends beyond an outer edge of the redistribution structure.

12. The device of claim 10, wherein an outer edge of the external connector extends beyond an outer edge of the redistribution structure.

13. The device of claim 10 further comprising:
a mechanical brace; and
a thermal module, the package component being disposed between the thermal module and the mechanical brace.

14. A device comprising:
a package component comprising:
integrated circuit dies;
an encapsulant at least partially surrounding the integrated circuit dies;
a redistribution structure on the encapsulant, the redistribution structure comprising redistribution lines connected to the integrated circuit dies;
module sockets attached to a center of the redistribution structure;
a first interposer attached to a first edge of the redistribution structure; and
external connectors attached to the first interposer, the external connectors extending beyond the first edge of the redistribution structure.

15. The device of claim 14 further comprising:
a second interposer attached to a second edge of the redistribution structure, the module sockets disposed between the first interposer and the second interposer in a top-down view.

16. The device of claim 14, wherein the external connectors partially vertically overlap the redistribution structure.

17. The device of claim 14, wherein the external connectors do not vertically overlap the redistribution structure.

18. The device of claim 14, wherein the external connectors are vertically offset from the module sockets.

19. The device of claim 14 further comprising:
a mechanical brace having openings exposing the module sockets in a top-down view; and
a thermal module, the package component being disposed between the thermal module and the mechanical brace.

20. The device of claim 19 further comprising:
bolts extending through the thermal module, the package component, and the mechanical brace.

* * * * *